(12) United States Patent
Wang et al.

(10) Patent No.: US 11,057,051 B2
(45) Date of Patent: Jul. 6, 2021

(54) FRACTALLY ENHANCED KERNEL POLAR CODING

(71) Applicant: QUALCOMM Incorporated, San Diego, CA (US)

(72) Inventors: Ying Wang, San Diego, CA (US); Jing Jiang, San Diego, CA (US); Wei Yang, San Diego, CA (US); Gabi Sarkis, San Diego, CA (US); Jing Lei, San Diego, CA (US); Seyong Park, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/538,451

(22) Filed: Aug. 12, 2019

(65) Prior Publication Data

US 2020/0052717 A1    Feb. 13, 2020

Related U.S. Application Data

(60) Provisional application No. 62/718,092, filed on Aug. 13, 2018.

(51) Int. Cl.
*H03M 13/13* (2006.01)
*H03M 13/00* (2006.01)
(Continued)

(52) U.S. Cl.
CPC ......... *H03M 13/13* (2013.01); *H03M 13/251* (2013.01); *H03M 13/6362* (2013.01);
(Continued)

(58) Field of Classification Search
CPC .............. H03M 13/13; H03M 13/618; H03M 13/6362; H04L 1/0041
See application file for complete search history.

(56) References Cited

U.S. PATENT DOCUMENTS

2006/0123277 A1\* 6/2006 Hocevar ............. H03M 13/618
                                                                714/704
2017/0331577 A1\* 11/2017 Parkvall ................ H04L 5/1469
(Continued)

FOREIGN PATENT DOCUMENTS

WO      2018126840 A1    7/2018

OTHER PUBLICATIONS

International Search Report and Written Opinion—PCT/US2019/046318—ISA/EPO—dated Nov. 5, 2019.
(Continued)

*Primary Examiner* — Joseph D Torres
(74) *Attorney, Agent, or Firm* — Harrity & Harrity, LLP/Qualcomm

(57) ABSTRACT

Various aspects of the present disclosure generally relate to wireless communication. In some aspects, a user equipment may construct, for adjusted fractally enhanced kernel (FRANK) polar coding, encoding code for encoding data of an ultra-reliable low latency (URLLC) communication, wherein an information bit assignment to an information bit set associated with the encoding code is performed based at least in part on an adjusted dimensionality factor, wherein the encoding code is all-stage FRANK polar code or partial-stage FRANK polar code, and wherein the encoding code is constructed for code block shortening or code block puncturing. In some aspects, the user equipment may transmit the URLLC communication encoded using the encoding code based at least in part on the information bit assignment to the information bit set. Numerous other aspects are provided.

50 Claims, 15 Drawing Sheets

(51) Int. Cl.
*H04L 1/00* (2006.01)
*H03M 13/25* (2006.01)

(52) U.S. Cl.
CPC .......... *H04L 1/0041* (2013.01); *H04L 1/0057* (2013.01); *H04L 1/0068* (2013.01)

(56) References Cited

U.S. PATENT DOCUMENTS

2018/0323905 A1* 11/2018 Shelby ................ H03M 13/033
2018/0351584 A1* 12/2018 Saber ................... H03M 13/09

OTHER PUBLICATIONS

QUALCOMM Incorporated: "Frank Polar Construction for NR Control Channel and Performance Comparison", 3GPP TSG-RAN WG1 #89, 3GPP Draft; R1-1709178 Frank Polar Construction for NR Control Channel and Performance Comparison, 3rd Generation Partnership Project (3GPP), Mobile Competence Centre; 650, Route Des Lucioles; F-06921, vol. RAN WG1, No. Hangzhou; May 15, 2017-May 19, 2017, May 17, 2017 (May 17, 2017), 27 Pages, XP051285058, Retrieved from the Internet: URL: http://www.3gpp.org/ftp/tsg_ran/WG1_RL1/TSGR1_89/Docs/.

QUALCOMM Incorporated: "Rate-Matching Scheme for Control Channel", 3GPP TSG-RAN WG1 NR Ad-Hoc#2, 3GPP Draft; R1-1711220 Rate-Matching Scheme for Control Channel, 3rd Generation Partnership Project (3GPP), Mobile Competence Centre; 650, Route Des Lucioles; F-06921 Sophia-Antipolis Cedex; France, vol. RAN WG1, No. Qingdao; Jun. 27, 2017-Jun. 30, 2017, Jun. 20, 2017 (Jun. 20, 2017), XP051305806, pp. 1-6, Retrieved from the Internet: URL: http://www.3gpp.org/ftp/tsg_ran/WG1_RL1/TSGR1_AH/NR_AH_1706/Docs/.

QUALCOMM Incorporated: "Rate-Matching Scheme for Control Channel", 3GPP TSG-RAN WG1 RAN1#90, 3GPP Draft; R1-1715267 Rate-Matching Scheme for Control Channel, 3rd Generation Partnership Project (3GPP), Mobile Competence Centre; 650, Route Des Lucioles; F-06921 Sophia-Antipolis Cedex; France, vol. RAN WG1, No. Prague, CZ; Aug. 21, 2017-Aug. 25, 2017, Aug. 26, 2017 (Aug. 26, 2017), pp. 1-20, XP051328741, Retrieved from the Internet: URL: http://www.3gpp.org/ftp/tsg_ran/WG1_RL1/TSGR1_90/Docs/ [retrieved on Aug. 26, 2017] Sections 2, 3 and 5.

* cited by examiner

FRACTALLY ENHANCED KERNEL POLAR CODING

CROSS-REFERENCE TO RELATED APPLICATIONS UNDER 35 U.S.C. § 119

This application claims priority to U.S. Provisional Patent Application No. 62/718,092, filed on Aug. 13, 2018, entitled "FRACTALLY ENHANCED KERNEL POLAR CODING," which is hereby expressly incorporated by reference herein.

FIELD OF THE DISCLOSURE

Aspects of the present disclosure generally relate to wireless communication, and more particularly to techniques and apparatuses for fractally enhanced kernel polar coding.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, and/or the like). Examples of such multiple-access technologies include code division multiple access (CDMA) systems, time division multiple access (TDMA) systems, frequency-division multiple access (FDMA) systems, orthogonal frequency-division multiple access (OFDMA) systems, single-carrier frequency-division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless communication network may include a number of base stations (BSs) that can support communication for a number of user equipment (UEs). A user equipment (UE) may communicate with a base station (BS) via the downlink and uplink. The downlink (or forward link) refers to the communication link from the BS to the UE, and the uplink (or reverse link) refers to the communication link from the UE to the BS. As will be described in more detail herein, a BS may be referred to as a Node B, a gNB, an access point (AP), a radio head, a transmit receive point (TRP), a New Radio (NR) BS, a 5G Node B, and/or the like.

The above multiple access technologies have been adopted in various telecommunication standards to provide a common protocol that enables different user equipment to communicate on a municipal, national, regional, and even global level. New Radio (NR), which may also be referred to as 5G, is a set of enhancements to the LTE mobile standard promulgated by the Third Generation Partnership Project (3GPP). NR is designed to better support mobile broadband Internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink (DL), using CP-OFDM and/or SC-FDM (e.g., also known as discrete Fourier transform spread OFDM (DFT-s-OFDM)) on the uplink (UL), as well as supporting beamforming, multiple-input multiple-output (MIMO) antenna technology, and carrier aggregation. However, as the demand for mobile broadband access continues to increase, there exists a need for further improvements in LTE and NR technologies. Preferably, these improvements should be applicable to other multiple access technologies and the telecommunication standards that employ these technologies.

SUMMARY

In some aspects, a method of wireless communication, performed by a transmitter device, may include constructing, for adjusted fractally enhanced kernel (FRANK) polar coding, encoding code for encoding data of an ultra-reliable low latency (URLLC) communication, wherein an information bit assignment to an information bit set associated with the encoding code is performed based at least in part on an adjusted dimensionality factor, wherein the encoding code is all-stage FRANK polar code or partial-stage FRANK polar code, and wherein the encoding code is constructed for code block shortening or code block puncturing; and transmitting the URLLC communication encoded using the encoding code based at least in part on the information bit assignment to the information bit set.

In some aspects, a method of wireless communication, performed by a receiver device, may include receiving an ultra-reliable low-latency communications (URLLC) communication encoded using an encoding code; determining, for adjusted fractally enhanced kernel (FRANK) polar coding, the encoding code for decoding data of the URLLC communication, wherein an information bit assignment to an information bit set associated with the encoding code is based at least in part on an adjusted dimensionality factor, wherein the encoding code is all-stage FRANK polar code or partial-stage FRANK polar code, and wherein the encoding code is constructed for code block shortening or code block puncturing; and decoding the data of the URLLC communication based at least in part on the information bit assignment to the information bit set.

In some aspects, a transmitter device for wireless communication may include memory and one or more processors operatively coupled to the memory. The memory and the one or more processors may be configured to construct, for adjusted fractally enhanced kernel (FRANK) polar coding, encoding code for encoding data of an ultra-reliable low latency (URLLC) communication, wherein an information bit assignment to an information bit set associated with the encoding code is performed based at least in part on an adjusted dimensionality factor, wherein the encoding code is all-stage FRANK polar code or partial-stage FRANK polar code, and wherein the encoding code is constructed for code block shortening or code block puncturing; and transmit the URLLC communication encoded using the encoding code based at least in part on the information bit assignment to the information bit set.

In some aspects, a receiver device for wireless communication may include memory and one or more processors operatively coupled to the memory. The memory and the one or more processors may be configured to receive an ultra-reliable low-latency communications (URLLC) communication encoded using an encoding code; determine, for adjusted fractally enhanced kernel (FRANK) polar coding, the encoding code for decoding data of the URLLC communication, wherein an information bit assignment to an information bit set associated with the encoding code is based at least in part on an adjusted dimensionality factor, wherein the encoding code is all-stage FRANK polar code or partial-stage FRANK polar code, and wherein the encoding code is constructed for code block shortening or code block puncturing; and decode the data of the URLLC communication based at least in part on the information bit assignment to the information bit set.

In some aspects, a non-transitory computer-readable medium may store one or more instructions for wireless communication. The one or more instructions, when executed by one or more processors of a receiver device, may cause the one or more processors to: construct, for adjusted fractally enhanced kernel (FRANK) polar coding, encoding code for encoding data of an ultra-reliable low latency (URLLC) communication, wherein an information bit assignment to an information bit set associated with the encoding code is performed based at least in part on an adjusted dimensionality factor, wherein the encoding code is all-stage FRANK polar code or partial-stage FRANK polar code, and wherein the encoding code is constructed for code block shortening or code block puncturing; and transmit the URLLC communication encoded using the encoding code based at least in part on the information bit assignment to the information bit set.

In some aspects, a non-transitory computer-readable medium may store one or more instructions for wireless communication. The one or more instructions, when executed by one or more processors of a receiver device, may cause the one or more processors to: receive an ultra-reliable low-latency communications (URLLC) communication encoded using an encoding code; determine, for adjusted fractally enhanced kernel (FRANK) polar coding, the encoding code for decoding data of the URLLC communication, wherein an information bit assignment to an information bit set associated with the encoding code is based at least in part on an adjusted dimensionality factor, wherein the encoding code is all-stage FRANK polar code or partial-stage FRANK polar code, and wherein the encoding code is constructed for code block shortening or code block puncturing; and decode the data of the URLLC communication based at least in part on the information bit assignment to the information bit set.

In some aspects, an apparatus for wireless communication may include means for constructing, for adjusted fractally enhanced kernel (FRANK) polar coding, encoding code for encoding data of an ultra-reliable low latency (URLLC) communication, wherein an information bit assignment to an information bit set associated with the encoding code is performed based at least in part on an adjusted dimensionality factor, wherein the encoding code is all-stage FRANK polar code or partial-stage FRANK polar code, and wherein the encoding code is constructed for code block shortening or code block puncturing; and means for transmitting the URLLC communication encoded using the encoding code based at least in part on the information bit assignment to the information bit set.

In some aspects, an apparatus for wireless communication may include means for receiving an ultra-reliable low-latency communications (URLLC) communication encoded using an encoding code; means for determining, for adjusted fractally enhanced kernel (FRANK) polar coding, the encoding code for decoding data of the URLLC communication, wherein an information bit assignment to an information bit set associated with the encoding code is based at least in part on an adjusted dimensionality factor, wherein the encoding code is all-stage FRANK polar code or partial-stage FRANK polar code, and wherein the encoding code is constructed for code block shortening or code block puncturing; and means for decoding the data of the URLLC communication based at least in part on the information bit assignment to the information bit set.

Aspects generally include a method, apparatus, system, computer program product, non-transitory computer-readable medium, user equipment, base station, wireless communication device, and processing system as substantially described herein with reference to and as illustrated by the accompanying drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purpose of illustration and description, and not as a definition of the limits of the claims.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based at least in part on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, and/or the like (collectively referred to as "elements"). These elements may be implemented using hardware, software, or combinations thereof. Whether such elements are implemented as hardware or software depends upon the particular application and design constraints imposed on the overall system.

It should be noted that while aspects may be described herein using terminology commonly associated with 3G and/or 4G wireless technologies, aspects of the present disclosure can be applied in other generation-based communication systems, such as 5G and later, including NR technologies.

Figure 1:
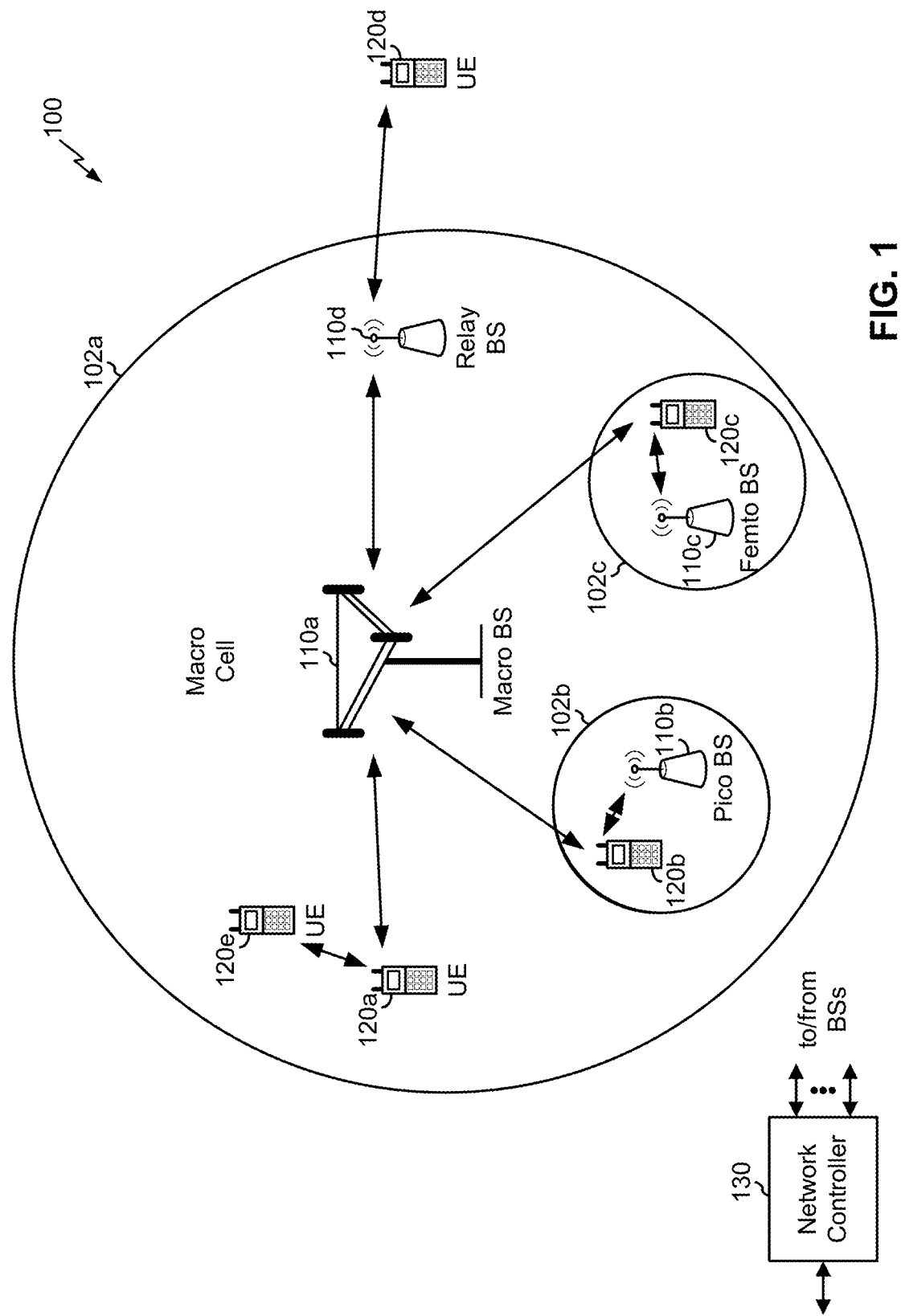
FIG. 1 is a block diagram conceptually illustrating an example of a wireless communication network, in accordance with various aspects of the present disclosure.

FIG. 1 is a diagram illustrating a network 100 in which aspects of the present disclosure may be practiced. The network 100 may be an LTE network or some other wireless network, such as a 5G or NR network. Wireless network 100 may include a number of BSs 110 (shown as BS 110a, BS 110b, BS 110c, and BS 110d) and other network entities. A BS is an entity that communicates with user equipment (UEs) and may also be referred to as a base station, a NR BS, a Node B, a gNB, a 5G node B (NB), an access point, a transmit receive point (TRP), and/or the like. Each BS may provide communication coverage for a particular geographic area. In 3GPP, the term "cell" can refer to a coverage area of a BS and/or a BS subsystem serving this coverage area, depending on the context in which the term is used.

A BS may provide communication coverage for a macro cell, a pico cell, a femto cell, and/or another type of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a closed subscriber group (CSG)). ABS for a macro cell may be referred to as a macro BS. ABS for a pico cell may be referred to as a pico BS. A BS for a femto cell may be referred to as a femto BS or a home BS. In the example shown in FIG. 1, a BS 110a may be a macro BS for a macro cell 102a, a BS 110b may be a pico BS for a pico cell 102b, and a BS 110c may be a femto BS for a femto cell 102c. A BS may support one or multiple (e.g., three) cells. The terms "eNB", "base station", "NR BS", "gNB", "TRP", "AP", "node B", "5G NB", and "cell" may be used interchangeably herein.

In some aspects, a cell may not necessarily be stationary, and the geographic area of the cell may move according to the location of a mobile BS. In some aspects, the BSs may be interconnected to one another and/or to one or more other BSs or network nodes (not shown) in the access network 100 through various types of backhaul interfaces such as a direct physical connection, a virtual network, and/or the like using any suitable transport network.

Wireless network 100 may also include relay stations. A relay station is an entity that can receive a transmission of data from an upstream station (e.g., a BS or a UE) and send a transmission of the data to a downstream station (e.g., a UE or a BS). A relay station may also be a UE that can relay transmissions for other UEs. In the example shown in FIG. 1, a relay station 110d may communicate with macro BS 110a and a UE 120d in order to facilitate communication between BS 110a and UE 120d. A relay station may also be referred to as a relay BS, a relay base station, a relay, and/or the like.

Wireless network 100 may be a heterogeneous network that includes BSs of different types, e.g., macro BSs, pico BSs, femto BSs, relay BSs, and/or the like. These different types of BSs may have different transmit power levels, different coverage areas, and different impacts on interference in wireless network 100. For example, macro BSs may have a high transmit power level (e.g., 5 to 40 Watts) whereas pico BSs, femto BSs, and relay BSs may have lower transmit power levels (e.g., 0.1 to 2 Watts).

A network controller 130 may couple to a set of BSs and may provide coordination and control for these BSs. Network controller 130 may communicate with the BSs via a backhaul. The BSs may also communicate with one another, e.g., directly or indirectly via a wireless or wireline backhaul.

UEs 120 (e.g., 120a, 120b, 120c) may be dispersed throughout wireless network 100, and each UE may be stationary or mobile. A UE may also be referred to as an access terminal, a terminal, a mobile station, a subscriber unit, a station, and/or the like. A UE may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device or equipment, biometric sensors/devices, wearable devices (smart watches, smart clothing, smart glasses, smart wrist bands, smart jewelry (e.g., smart ring, smart bracelet)), an entertainment device (e.g., a music or video device, or a satellite radio), a vehicular component or sensor, smart meters/sensors, industrial manufacturing equipment, a global positioning system device, or any other suitable device that is configured to communicate via a wireless or wired medium.

Some UEs may be considered machine-type communication (MTC) or evolved or enhanced machine-type communication (eMTC) UEs. MTC and eMTC UEs include, for example, robots, drones, remote devices, sensors, meters, monitors, location tags, and/or the like, that may communicate with a base station, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, and/or may be implemented as NB-IoT (narrowband internet of things) devices. Some UEs may be considered a Customer Premises Equipment (CPE). UE 120 may be included inside a housing that houses components of UE 120, such as processor components, memory components, and/or the like.

In general, any number of wireless networks may be deployed in a given geographic area. Each wireless network may support a particular RAT and may operate on one or more frequencies. A RAT may also be referred to as a radio technology, an air interface, and/or the like. A frequency may also be referred to as a carrier, a frequency channel, and/or the like. Each frequency may support a single RAT in a given geographic area in order to avoid interference between wireless networks of different RATs. In some cases, NR or 5G RAT networks may be deployed.

In some aspects, two or more UEs 120 (e.g., shown as UE 120a and UE 120e) may communicate directly using one or more sidelink channels (e.g., without using a base station 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol, a vehicle-to-infrastructure (V2I) protocol, and/or the like), a mesh network, and/or the like. In this case, the UE 120 may perform scheduling operations, resource selection operations, and/or other operations described elsewhere herein as being performed by the base station 110.

As indicated above, FIG. 1 is provided merely as an example. Other examples may differ from what is described with regard to FIG. 1.

Figure 2:
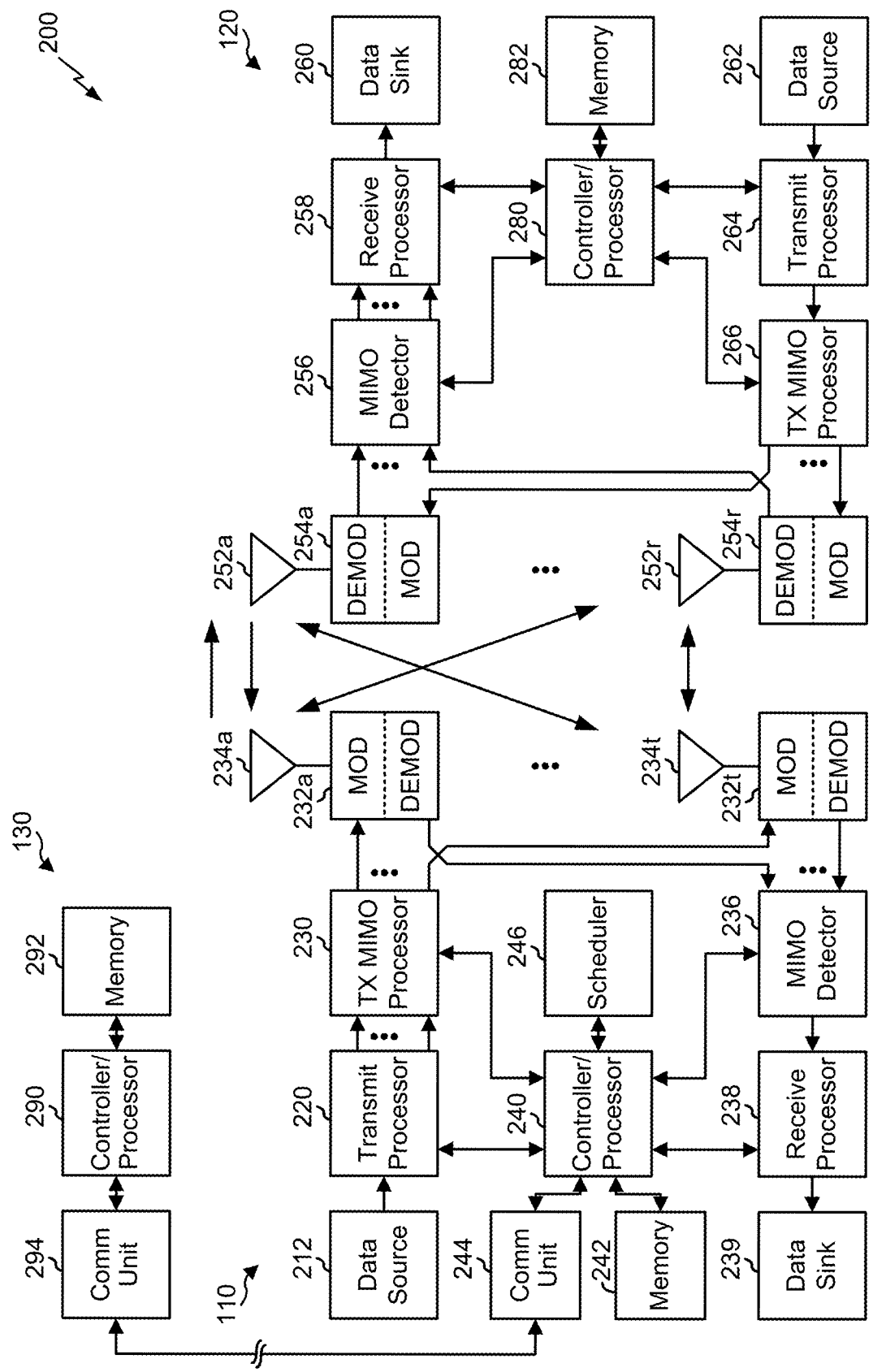
FIG. 2 is a block diagram conceptually illustrating an example of a base station in communication with a user equipment (UE) in a wireless communication network, in accordance with various aspects of the present disclosure.

FIG. 2 shows a block diagram of a design 200 of base station 110 and UE 120, which may be one of the base stations and one of the UEs in FIG. 1. Base station 110 may be equipped with T antennas 234a through 234t, and UE 120 may be equipped with R antennas 252a through 252r, where in general T≥1 and R≥1.

At base station 110, a transmit processor 220 may receive data from a data source 212 for one or more UEs, select one or more modulation and coding schemes (MCS) for each UE based at least in part on channel quality indicators (CQIs) received from the UE, process (e.g., encode and modulate) the data for each UE based at least in part on the MCS selected for the UE, and provide data symbols for all UEs. Transmit processor 220 may also process system information (e.g., for semi-static resource partitioning information (SRPI) and/or the like) and control information (e.g., CQI requests, grants, upper layer signaling, and/or the like) and provide overhead symbols and control symbols. Transmit processor 220 may also generate reference symbols for reference signals (e.g., the cell-specific reference signal (CRS)) and synchronization signals (e.g., the primary synchronization signal (PSS) and secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide T output symbol streams to T modulators (MODs) 232a through 232t. Each modulator 232 may process a respective output symbol stream (e.g., for OFDM and/or the like) to obtain an output sample stream. Each modulator 232 may further process (e.g., convert to analog, amplify, filter, and upconvert) the output sample stream to obtain a downlink signal. T downlink signals from modulators 232a through 232t may be transmitted via T antennas 234a through 234t, respectively. According to various aspects described in more detail below, the synchronization signals can be generated with location encoding to convey additional information.

At UE 120, antennas 252a through 252r may receive the downlink signals from base station 110 and/or other base stations and may provide received signals to demodulators (DEMODs) 254a through 254r, respectively. Each demodulator 254 may condition (e.g., filter, amplify, downconvert, and digitize) a received signal to obtain input samples. Each demodulator 254 may further process the input samples (e.g., for OFDM and/or the like) to obtain received symbols. A MIMO detector 256 may obtain received symbols from all R demodulators 254a through 254r, perform MIMO detection on the received symbols if applicable, and provide detected symbols. A receive processor 258 may process (e.g., demodulate and decode) the detected symbols, provide decoded data for UE 120 to a data sink 260, and provide decoded control information and system information to a controller/processor 280. A channel processor may determine reference signal received power (RSRP), received signal strength indicator (RSSI), reference signal received quality (RSRQ), channel quality indicator (CQI), and/or the like. In some aspects, one or more components of UE 120 may be included in a housing.

On the uplink, at UE 120, a transmit processor 264 may receive and process data from a data source 262 and control information (e.g., for reports comprising RSRP, RSSI, RSRQ, CQI, and/or the like) from controller/processor 280. Transmit processor 264 may also generate reference symbols for one or more reference signals. The symbols from transmit processor 264 may be precoded by a TX MIMO processor 266 if applicable, further processed by modulators 254a through 254r (e.g., for DFT-s-OFDM, CP-OFDM, and/or the like), and transmitted to base station 110. At base station 110, the uplink signals from UE 120 and other UEs may be received by antennas 234, processed by demodulators 232, detected by a MIMO detector 236 if applicable, and further processed by a receive processor 238 to obtain decoded data and control information sent by UE 120. Receive processor 238 may provide the decoded data to a data sink 239 and the decoded control information to controller/processor 240. Base station 110 may include communication unit 244 and communicate to network controller 130 via communication unit 244. Network controller 130 may include communication unit 294, controller/processor 290, and memory 292.

Controller/processor 240 of base station 110, controller/processor 280 of UE 120, and/or any other component(s) of FIG. 2 may perform one or more techniques associated with fractally enhanced kernel polar coding, as described in more detail elsewhere herein. For example, controller/processor 240 of base station 110, controller/processor 280 of UE 120, and/or any other component(s) of FIG. 2 may perform or direct operations of, for example, process 900 of FIG. 9, process 1000 of FIG. 10, and/or other processes as described herein. Memories 242 and 282 may store data and program codes for base station 110 and UE 120, respectively. A scheduler 246 may schedule UEs for data transmission on the downlink and/or uplink.

In some aspects, a transmitter device (e.g., base station 110, UE 120, and/or the like) may include means for constructing, for fractally enhanced kernel (FRANK) polar coding, encoding code for encoding data of an ultra-reliable low latency (URLLC) communication, wherein an information bit assignment to an information bit set associated with the encoding code is performed based at least in part on an adjusted dimensionality factor, wherein the encoding code is all-stage FRANK polar code or partial-stage FRANK polar code, and wherein the encoding code is constructed for code block shortening or code block puncturing; means for transmitting the URLLC communication encoded using the encoding code based at least in part on the information bit assignment to the information bit set; and/or the like. In some aspects, such means may include one or more components of base station 110, UE 120, and/or the like described in connection with FIG. 2.

In some aspects, a receiver device (e.g., base station 110, UE 120, and/or the like) may include means for receiving an ultra-reliable low-latency communications (URLLC) communication encoded using a code; means for determining, for adjusted fractally enhanced kernel (FRANK) polar coding, encoding code for decoding data of the URLLC communication, wherein an information bit assignment to an information bit set associated with the encoding code is based at least in part on an adjusted dimensionality factor, wherein the encoding code is all-stage FRANK polar code or partial-stage FRANK polar code, and wherein the encoding code is constructed for code block shortening or code block puncturing; means for decoding the data of the URLLC communication based at least in part on the information bit assignment to the information bit set; and/or the like. In some aspects, such means may include one or more components of base station 110, UE 120, and/or the like described in connection with FIG. 2.

As indicated above, FIG. 2 is provided merely as an example. Other examples may differ from what is described with regard to FIG. 2.

Figure 3A:
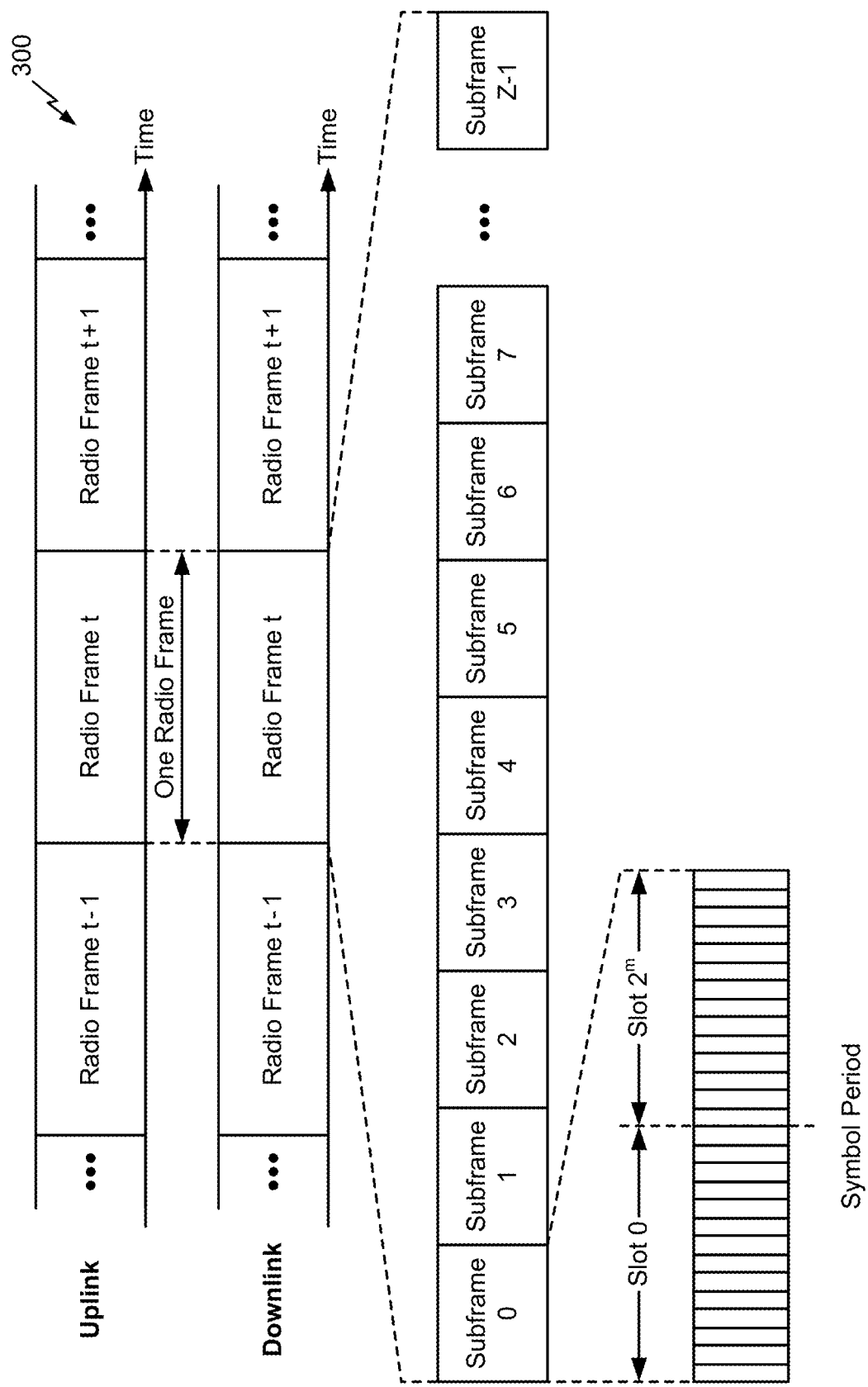
FIG. 3A is a block diagram conceptually illustrating an example of a frame structure in a wireless communication network, in accordance with various aspects of the present disclosure.

FIG. 3A shows an example frame structure 300 for FDD in a telecommunications system (e.g., NR). The transmission timeline for each of the downlink and uplink may be partitioned into units of radio frames (sometimes referred to as frames). Each radio frame may have a predetermined duration (e.g., 10 milliseconds (ms)) and may be partitioned into a set of Z (Z≥1) subframes (e.g., with indices of 0 through Z−1). Each subframe may have a predetermined duration (e.g., 1 ms) and may include a set of slots (e.g., $2^m$ slots per subframe are shown in FIG. 3A, where m is a numerology used for a transmission, such as 0, 1, 2, 3, 4, and/or the like). Each slot may include a set of L symbol periods. For example, each slot may include fourteen symbol periods (e.g., as shown in FIG. 3A), seven symbol periods, or another number of symbol periods. In a case where the subframe includes two slots (e.g., when m=1), the subframe may include 2L symbol periods, where the 2L symbol periods in each subframe may be assigned indices of 0 through 2L−1. In some aspects, a scheduling unit for the FDD may frame-based, subframe-based, slot-based, symbol-based, and/or the like.

While some techniques are described herein in connection with frames, subframes, slots, and/or the like, these techniques may equally apply to other types of wireless communication structures, which may be referred to using terms other than "frame," "subframe," "slot," and/or the like in 5G NR. In some aspects, a wireless communication structure may refer to a periodic time-bounded communication unit defined by a wireless communication standard and/or protocol. Additionally, or alternatively, different configurations of wireless communication structures than those shown in FIG. 3A may be used.

In certain telecommunications (e.g., NR), a base station may transmit synchronization signals. For example, a base station may transmit a primary synchronization signal (PSS), a secondary synchronization signal (SSS), and/or the like, on the downlink for each cell supported by the base station. The PSS and SSS may be used by UEs for cell search and acquisition. For example, the PSS may be used by UEs to determine symbol timing, and the SSS may be used by UEs to determine a physical cell identifier, associated with the base station, and frame timing. The base station may also transmit a physical broadcast channel (PBCH). The PBCH may carry some system information, such as system information that supports initial access by UEs.

In some aspects, the base station may transmit the PSS, the SSS, and/or the PBCH in accordance with a synchronization communication hierarchy (e.g., a synchronization signal (SS) hierarchy) including multiple synchronization communications (e.g., SS blocks), as described below in connection with FIG. 3B.

Figure 3B:
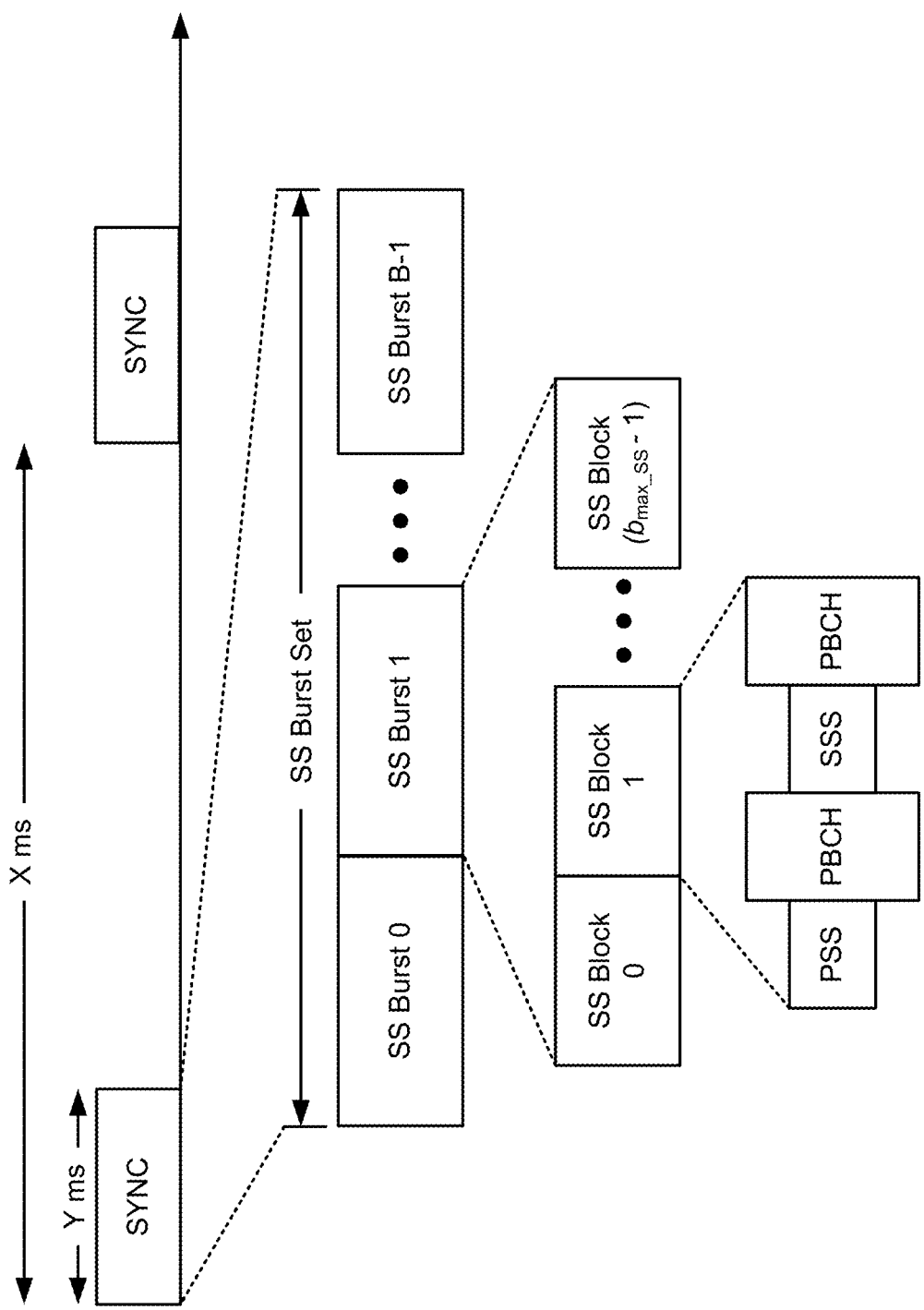
FIG. 3B is a block diagram conceptually illustrating an example synchronization communication hierarchy in a wireless communication network, in accordance with various aspects of the present disclosure.

FIG. 3B is a block diagram conceptually illustrating an example SS hierarchy, which is an example of a synchronization communication hierarchy. As shown in FIG. 3B, the SS hierarchy may include an SS burst set, which may include a plurality of SS bursts (identified as SS burst 0 through SS burst B−1, where B is a maximum number of repetitions of the SS burst that may be transmitted by the base station). As further shown, each SS burst may include one or more SS blocks (identified as SS block 0 through SS block ($b_{max\_SS}$-1), where $b_{max\_SS}$-1 is a maximum number of SS blocks that can be carried by an SS burst). In some aspects, different SS blocks may be beam-formed differently. An SS burst set may be periodically transmitted by a wireless node, such as every X milliseconds, as shown in FIG. 3B. In some aspects, an SS burst set may have a fixed or dynamic length, shown as Y milliseconds in FIG. 3B.

The SS burst set shown in FIG. 3B is an example of a synchronization communication set, and other synchronization communication sets may be used in connection with the techniques described herein. Furthermore, the SS block shown in FIG. 3B is an example of a synchronization communication, and other synchronization communications may be used in connection with the techniques described herein.

In some aspects, an SS block includes resources that carry the PSS, the SSS, the PBCH, and/or other synchronization signals (e.g., a tertiary synchronization signal (TSS)) and/or synchronization channels. In some aspects, multiple SS blocks are included in an SS burst, and the PSS, the SSS, and/or the PBCH may be the same across each SS block of the SS burst. In some aspects, a single SS block may be included in an SS burst. In some aspects, the SS block may be at least four symbol periods in length, where each symbol carries one or more of the PSS (e.g., occupying one symbol), the SSS (e.g., occupying one symbol), and/or the PBCH (e.g., occupying two symbols).

In some aspects, the symbols of an SS block are consecutive, as shown in FIG. 3B. In some aspects, the symbols of an SS block are non-consecutive. Similarly, in some aspects, one or more SS blocks of the SS burst may be transmitted in consecutive radio resources (e.g., consecutive symbol periods) during one or more slots. Additionally, or alternatively, one or more SS blocks of the SS burst may be transmitted in non-consecutive radio resources.

In some aspects, the SS bursts may have a burst period, whereby the SS blocks of the SS burst are transmitted by the base station according to the burst period. In other words, the SS blocks may be repeated during each SS burst. In some aspects, the SS burst set may have a burst set periodicity, whereby the SS bursts of the SS burst set are transmitted by the base station according to the fixed burst set periodicity. In other words, the SS bursts may be repeated during each SS burst set.

The base station may transmit system information, such as system information blocks (SIBs) on a physical downlink shared channel (PDSCH) in certain slots. The base station may transmit control information/data on a physical downlink control channel (PDCCH) in C symbol periods of a slot, where B may be configurable for each slot. The base station may transmit traffic data and/or other data on the PDSCH in the remaining symbol periods of each slot.

As indicated above, FIGS. 3A and 3B are provided as examples. Other examples may differ from what is described with regard to FIGS. 3A and 3B.

Figure 4:
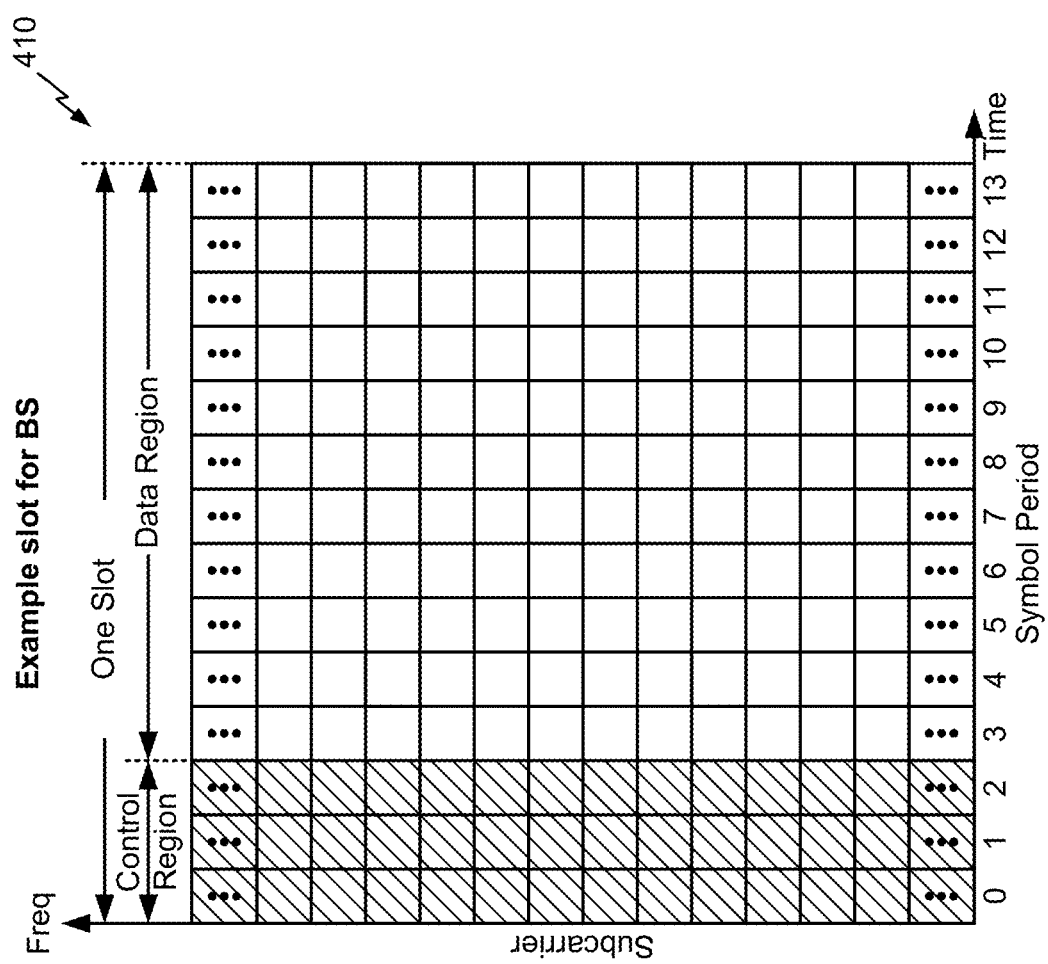
FIG. 4 is a block diagram conceptually illustrating an example slot format with a normal cyclic prefix, in accordance with various aspects of the present disclosure.

FIG. 4 shows an example slot format 410 with a normal cyclic prefix. The available time frequency resources may be partitioned into resource blocks. Each resource block may cover a set to of subcarriers (e.g., 12 subcarriers) in one slot and may include a number of resource elements. Each resource element may cover one subcarrier in one symbol period (e.g., in time) and may be used to send one modulation symbol, which may be a real or complex value.

An interlace structure may be used for each of the downlink and uplink for FDD in certain telecommunications systems (e.g., NR). For example, Q interlaces with indices of 0 through Q−1 may be defined, where Q may be equal to 4, 6, 8, 10, or some other value. Each interlace may include slots that are spaced apart by Q frames. In particular, interlace q may include slots q, q+Q, q+2Q, etc., where $q \in \{0, \ldots, Q-1\}$.

A UE may be located within the coverage of multiple BSs. One of these BSs may be selected to serve the UE. The serving BS may be selected based at least in part on various criteria such as received signal strength, received signal quality, path loss, and/or the like. Received signal quality may be quantified by a signal-to-noise-and-interference ratio (SINR), or a reference signal received quality (RSRQ), or some other metric. The UE may operate in a dominant interference scenario in which the UE may observe high interference from one or more interfering BSs.

While aspects of the examples described herein may be associated with NR or 5G technologies, aspects of the present disclosure may be applicable with other wireless communication systems. New Radio (NR) may refer to radios configured to operate according to a new air interface (e.g., other than Orthogonal Frequency Divisional Multiple Access (OFDMA)-based air interfaces) or fixed transport layer (e.g., other than Internet Protocol (IP)). In aspects, NR may utilize OFDM with a CP (herein referred to as cyclic prefix OFDM or CP-OFDM) and/or SC-FDM on the uplink, may utilize CP-OFDM on the downlink and include support for half-duplex operation using TDD. In aspects, NR may, for example, utilize OFDM with a CP (herein referred to as CP-OFDM) and/or discrete Fourier transform spread orthogonal frequency-division multiplexing (DFT-s-OFDM) on the uplink, may utilize CP-OFDM on the downlink and include support for half-duplex operation using time division duplexing (TDD). NR may include Enhanced Mobile Broadband (eMBB) service targeting wide bandwidth (e.g., 80 megahertz (MHz) and beyond), millimeter wave (mmW) targeting high carrier frequency (e.g., 60 gigahertz (GHz)), massive MTC (mMTC) targeting non-backward compatible MTC techniques, and/or mission critical targeting ultra reliable low latency communications (URLLC) service.

In some aspects, a single component carrier bandwidth of 100 MHz may be supported. NR resource blocks may span 12 sub-carriers with a sub-carrier bandwidth of 60 or 120 kilohertz (kHz) over a 0.1 millisecond (ms) duration. Each radio frame may include 40 slots and may have a length of 10 ms. Consequently, each slot may have a length of 0.25 ms. Each slot may indicate a link direction (e.g., DL or UL) for data transmission and the link direction for each slot may be dynamically switched. Each slot may include DL/UL data as well as DL/UL control data.

Beamforming may be supported and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells. Alternatively, NR may support a different air interface, other than an OFDM-based interface. NR networks may include entities such central units or distributed units.

As indicated above, FIG. 4 is provided as an example. Other examples may differ from what is described with regard to FIG. 4.

Figure 5:
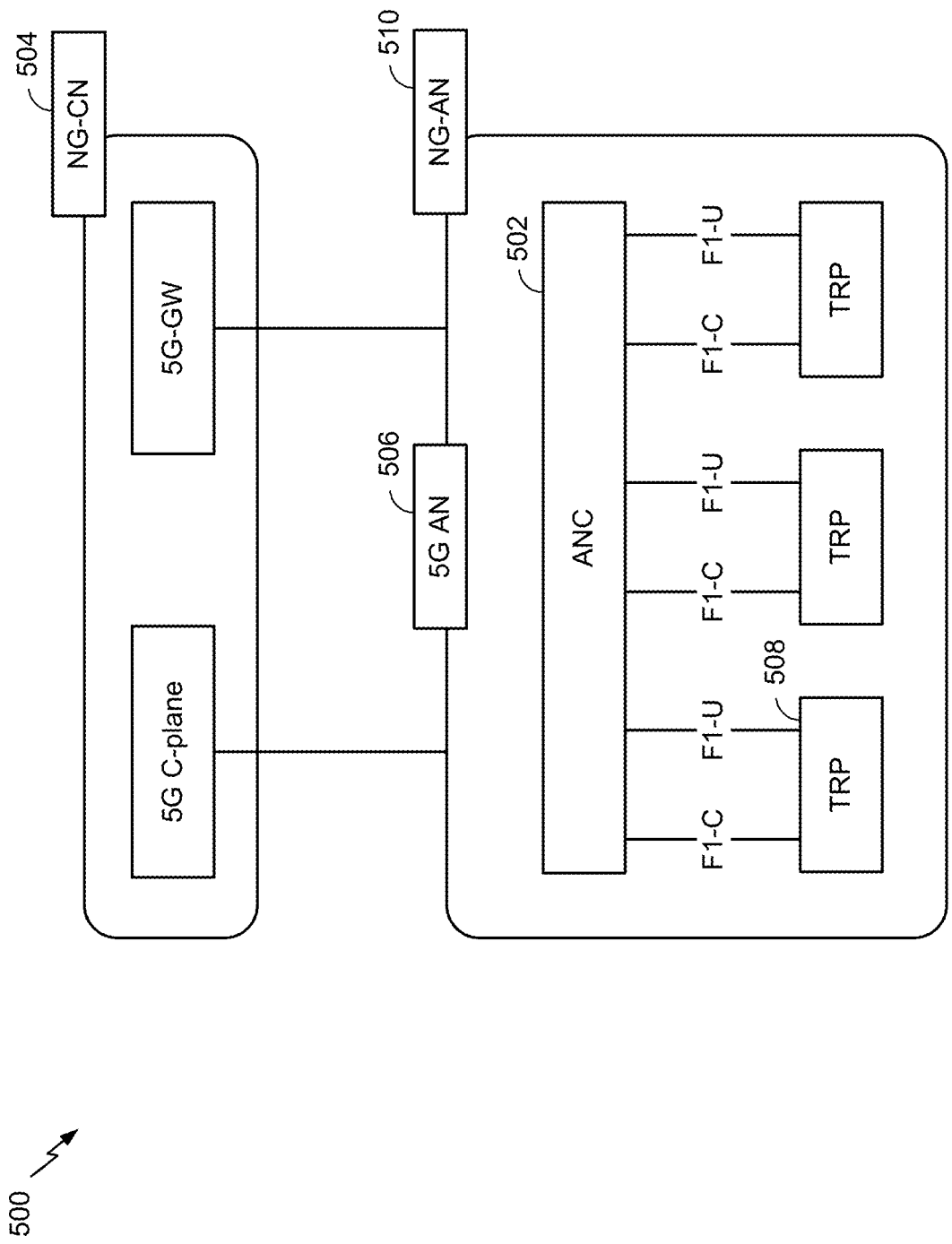
FIG. 5 illustrates an example logical architecture of a distributed radio access network (RAN), in accordance with various aspects of the present disclosure.

FIG. 5 illustrates an example logical architecture of a distributed RAN 500, according to aspects of the present disclosure. A 5G access node 506 may include an access node controller (ANC) 502. The ANC may be a central unit (CU) of the distributed RAN 500. The backhaul interface to the next generation core network (NG-CN) 504 may terminate at the ANC. The backhaul interface to neighboring next generation access nodes (NG-ANs) may terminate at the ANC. The ANC may include one or more TRPs 508 (which may also be referred to as BSs, NR BSs, Node Bs, 5G NBs, APs, gNB, or some other term). As described above, a TRP may be used interchangeably with "cell."

The TRPs 508 may be a distributed unit (DU). The TRPs may be connected to one ANC (ANC 502) or more than one ANC (not illustrated). For example, for RAN sharing, radio as a service (RaaS), and service specific AND deployments, the TRP may be connected to more than one ANC. A TRP may include one or more antenna ports. The TRPs may be configured to individually (e.g., dynamic selection) or jointly (e.g., joint transmission) serve traffic to a UE.

The local architecture of RAN 500 may be used to illustrate fronthaul definition. The architecture may be defined that support fronthauling solutions across different deployment types. For example, the architecture may be based at least in part on transmit network capabilities (e.g., bandwidth, latency, and/or jitter).

The architecture may share features and/or components with LTE. According to aspects, the next generation AN (NG-AN) 510 may support dual connectivity with NR. The NG-AN may share a common fronthaul for LTE and NR.

The architecture may enable cooperation between and among TRPs 508. For example, cooperation may be preset within a TRP and/or across TRPs via the ANC 502. According to aspects, no inter-TRP interface may be needed/present.

According to aspects, a dynamic configuration of split logical functions may be present within the architecture of RAN 500. The packet data convergence protocol (PDCP), radio link control (RLC), media access control (MAC) protocol may be adaptably placed at the ANC or TRP.

According to various aspects, a BS may include a central unit (CU) (e.g., ANC 502) and/or one or more distributed units (e.g., one or more TRPs 508).

As indicated above, FIG. 5 is provided merely as an example. Other examples may differ from what is described with regard to FIG. 5.

Figure 6:
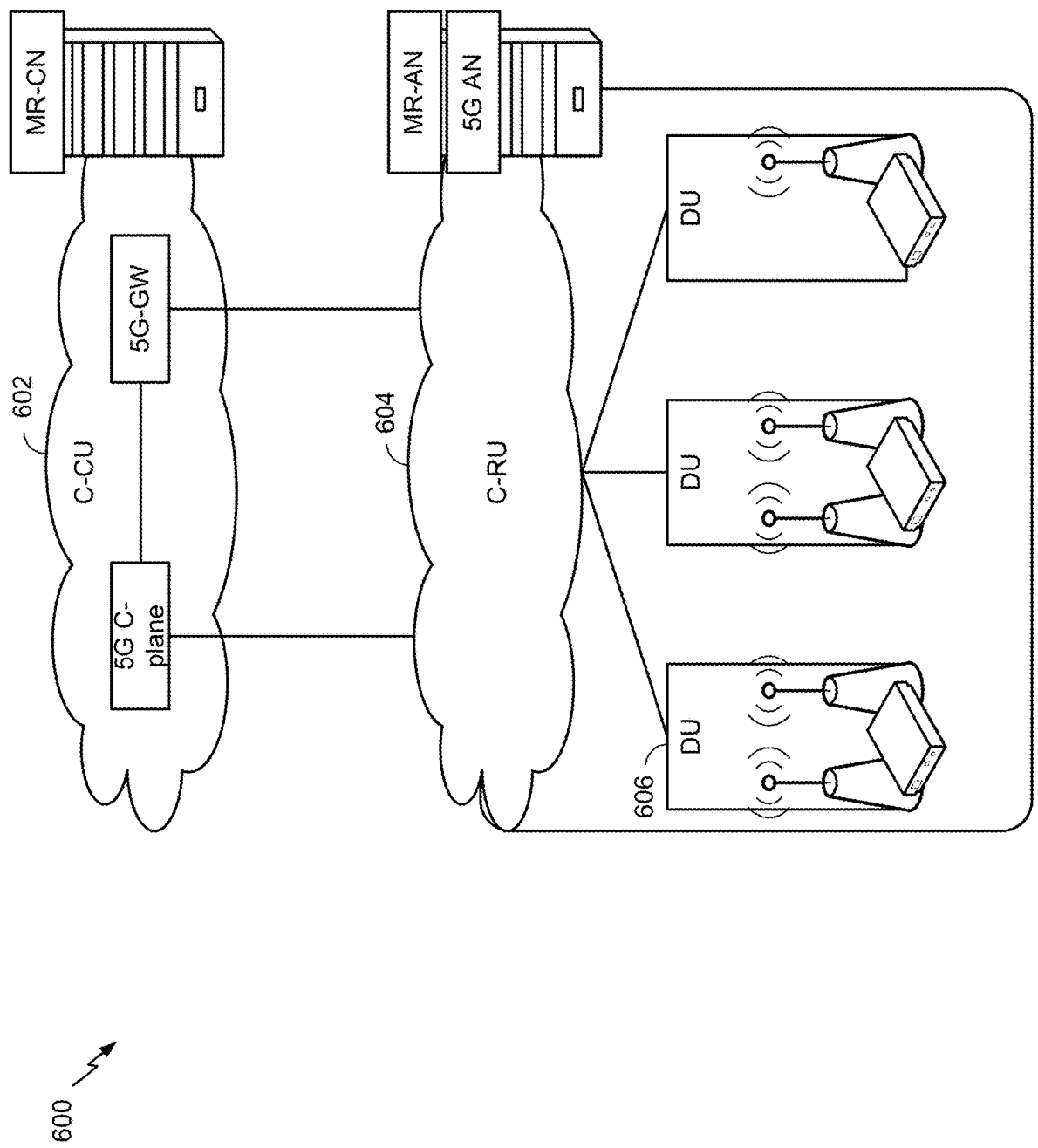
FIG. 6 illustrates an example physical architecture of a distributed RAN, in accordance with various aspects of the present disclosure.

FIG. 6 illustrates an example physical architecture of a distributed RAN 600, according to aspects of the present disclosure. A centralized core network unit (C-CU) 602 may host core network functions. The C-CU may be centrally deployed. C-CU functionality may be offloaded (e.g., to advanced wireless services (AWS)), in an effort to handle peak capacity.

A centralized RAN unit (C-RU) 604 may host one or more ANC functions. Optionally, the C-RU may host core network functions locally. The C-RU may have distributed deployment. The C-RU may be closer to the network edge.

A distributed unit (DU) 606 may host one or more TRPs. The DU may be located at edges of the network with radio frequency (RF) functionality.

As indicated above, FIG. 6 is provided merely as an example. Other examples may differ from what is described with regard to FIG. 6.

In some communications systems, such as 5G or NR, a transmitter device may encode data and may transmit the encoded data to a receiver device. For example, a UE may encode data, and may transmit the encoded data to a BS. Additionally, or alternatively, a BS may encode data, and may transmit the encoded data to a UE. In some cases, polar coding may be selected for use in encoding the data.

However, NR polar coding for enhanced mobile broadband (eMBB) control channels may be associated with a maximum blocklength, a restricted set of rate matching patterns, and/or the like. Moreover, polar coding may not support hybrid automatic repeat request (HARM) transmission, which may cause a transmitter device that encodes data using polar coding to not satisfy a reliability criterion associated with ultra-reliable low-latency communication (URLLC) service.

In some cases, a transmitter device may use a particular type of polar coding, such as all-stage fractally enhanced kernel (FRANK) polar coding. FRANK polar coding removes a restriction on a maximum blocklength and rate matching pattern. In this case, a quantity of stages is log 2(N), where N is a power of 2 value greater than or equal to a blocklength; a sequence of length N may be recursively divided into two sub-sequences; and the quantity of information bits for each subsequence is determined recursively based at least in part on a mutual information allocation and a rate matching pattern.

Figure 7:
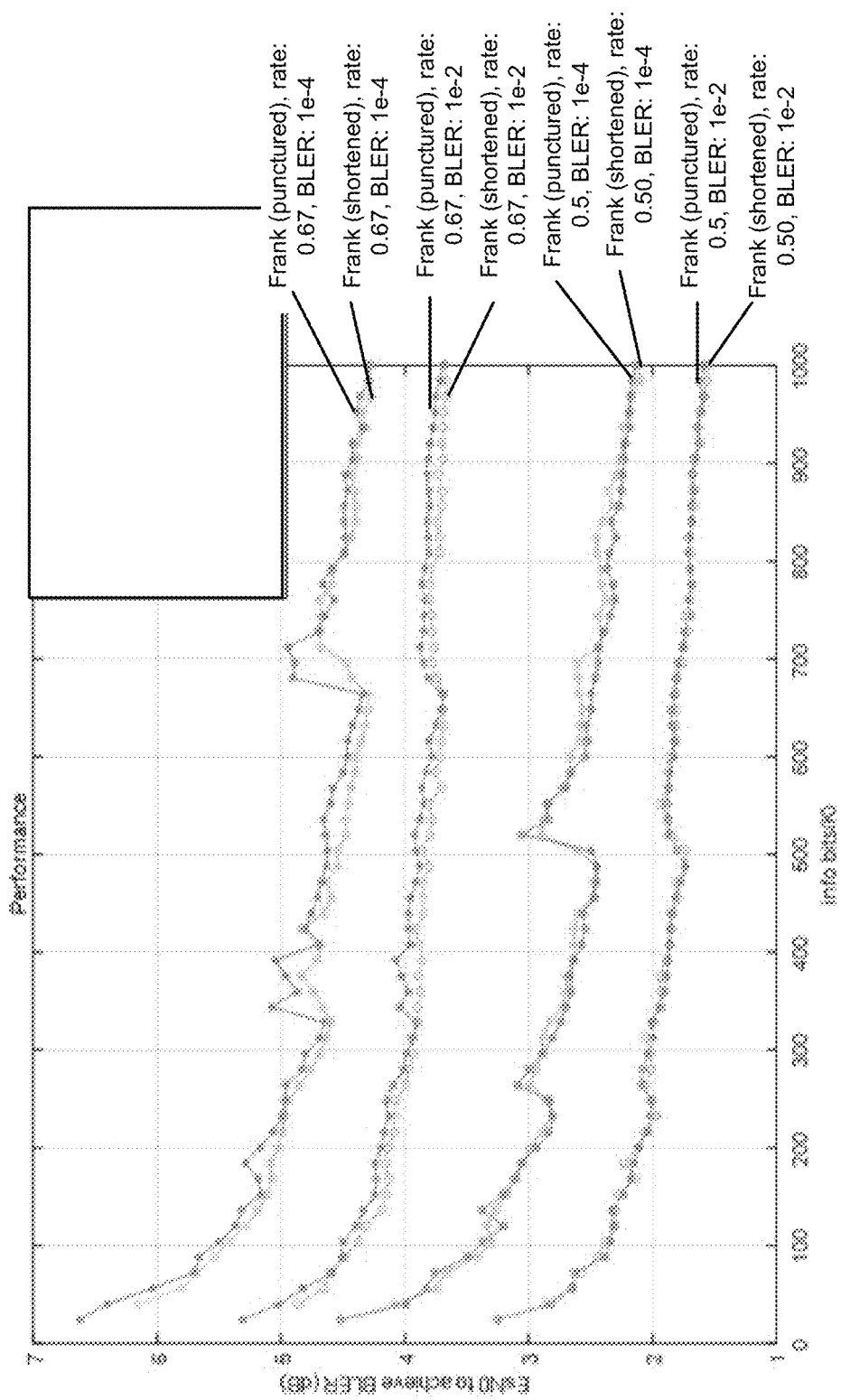
FIG. 7 is a diagram illustrating an example of fractally enhanced kernel polar coding, in accordance with various aspects of the present disclosure.

FIG. 7 is a diagram illustrating an example 700 of fractally enhanced kernel polar coding, in accordance with various aspects of the present disclosure.

With regard to FIG. 7, FRANK polar coding may be associated with block error rate (BLER) spikes, which may result in poor network performance. For example, an achievable SNR at a target BLER at a first blocklength may be greater than an achievable SNR at the same target BLER at a second blocklength that is similar to the first block length, which may cause a spike, as shown in FIG. 7. Such spikes may be caused by nonuniform polarization speed due to a relatively large fraction of punctured/shortened bits, which may result in poor coding performance.

As indicated above, FIG. 7 is provided as an example. Other examples may differ from what is described with respect to FIG. 7.

All-stage Frank polar code may be associated with a construction complexity that may be too high for construction by a transmitter device within a threshold period of time, thereby causing the transmitter device to not satisfy a time delay requirement of URLLC. To reduce the construction complexity and resource overhead, the transmitter device may use partial-stage FRANK polar coding. When a length of a sequence satisfies a threshold, the sequence is divided into two sub-sequences recursively, and a quantity of information bits for each sub-sequence is computed based on a mutual information allocation. The recursive process continues until each sub-sequence does not exceed the threshold length. When the length of a sub-sequence is within a threshold, the information bit set of each sub-sequence is selected based on a pre-determined reliability order. The pre-determined reliability order may be determined by partial weight (PW) order or by numerical search.

Some implementations described herein may provide an adjusted construction scheme for both all-stage and partial-stage FRANK polar code. For example, a transmitter device may construct an adjusted FRANK polar code based at least in part on an adjusted dimensionality factor and may use the adjusted FRANK polar code for encoding data for transmission. In this case, the transmitter device may transmit the encoded data, thereby improving network performance relative to transmission using polar code constructed from other techniques.

Figure 8A:
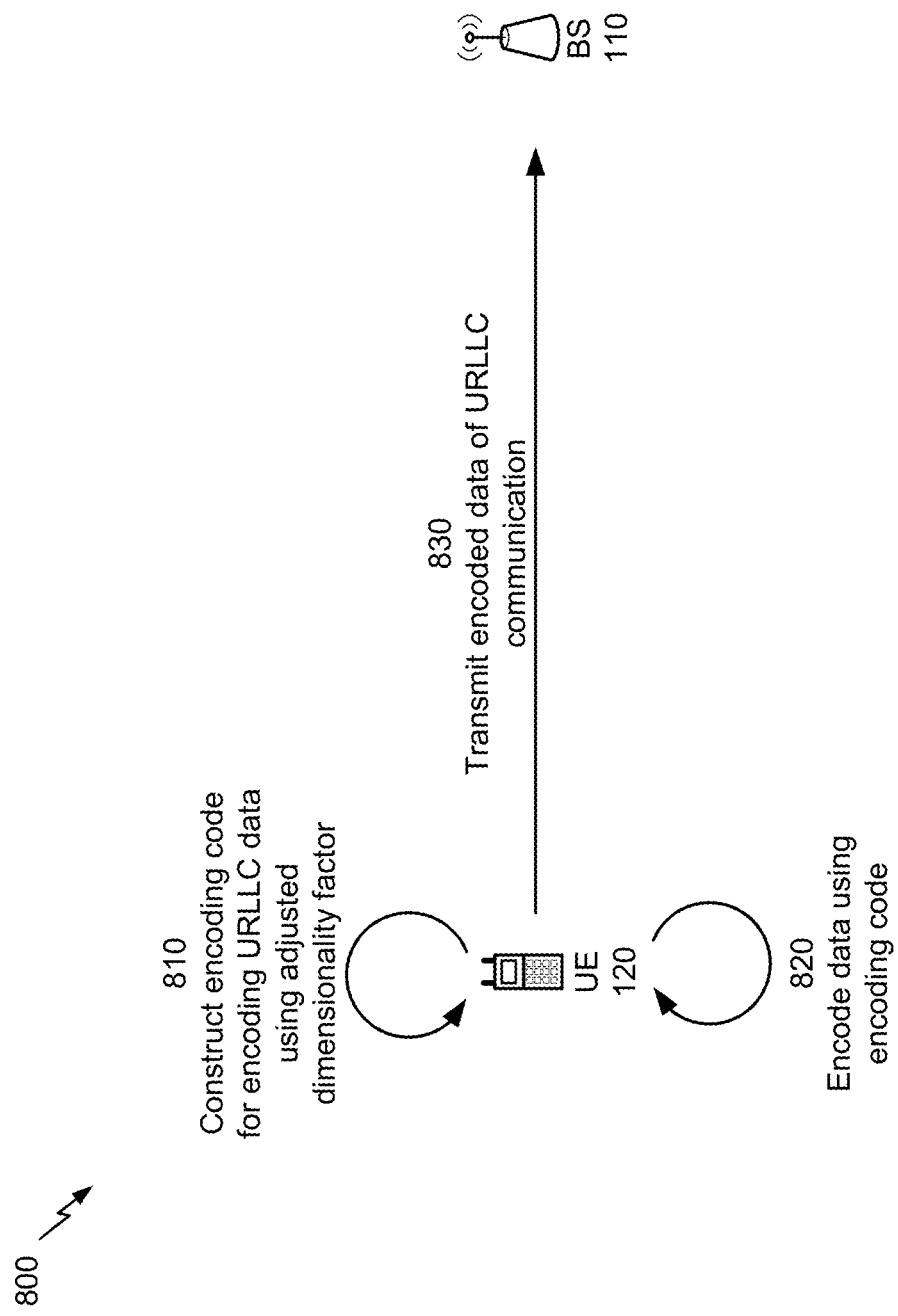
FIGS. 8A-8E are diagrams illustrating an example of adjusted fractally enhanced kernel polar coding, in accordance with various aspects of the present disclosure.

FIGS. 8A-8E are diagrams illustrating examples 800 of fractally enhanced kernel polar coding, in accordance with various aspects of the present disclosure. As shown in FIG. 8A, example 800 includes a BS 110 and a UE 120.

As further shown in FIG. 8A, and by reference number 810, UE 120 may construct code for encoding URLLC data. For example, UE 120 may construct adjusted all-stage FRANK polar code for encoding URLLC data. Additionally, or alternatively, UE 120 may construct the adjusted partial-stage FRANK polar code for encoding URLLC data. In some aspects, UE 120 may perform code block shortening or code block puncturing when constructing code for encoding URLLC data. In some aspects, UE 120 may determine an information bit assignment to an information bit set based at least in part on an adjusted dimensionality factor, as described in more detail below, to construct adjusted all-stage FRANK polar code, adjusted partial-stage FRANK polar code, and/or the like. For example, UE 120 may determine to add one or more information bits to an information bit set and remove another one or more information bits, where a first quantity of information bits that are added and a second quantity of bits that are removed are a common quantity (e.g., the same information bits, the same quantity of different information bits, and/or the like) to construct the encoding code. In some aspects, UE 120 may determine the quantity of information bits for assignment to the information bit set based at least in part on a reliability characteristic relating to the information bits, a location of the information bits in the information bit set, an error propagation characteristic of the information bits, a mutual information allocation characteristic, a length characteristic of a sub-sequence of code, and/or the like.

Although some aspects described herein are described in terms of UE 120 constructing code and transmitting encoded data, another transmitter device, such as BS 110, may construct code and transmit encoded data.

In some aspects, UE 120 may construct adjusted all-stage punctured FRANK polar code for encoding the URLLC data using an adjusted dimensionality factor. For example, UE 120 may determine a value N, such that:

$$N=2^{\lceil \log 2(M) \rceil}$$

where N represents a configurable value and M represents a blocklength of a block for transmitting. UE 120 may select a first quantity of bits, P, for puncturing, such that:

$$P=N-M.$$

where a first P bits are punctured in a length-N sequence. In this case, UE 120 may determine mutual information (MI) values for each bit, such that:

$$MI_{punctured}=(K+\Delta K)/M$$

$$MI_{non\text{-}punctured}=0$$

where K represents an information bit length and $\Delta K$ represents a configurable parameter, as described below. Further, UE 120 may determine a set of dimensionality factors, $K_0$ and $K_1$, based at least in part on mutual information values for a first half of a blocklength and a second half of a blocklength, respectively, such that:

$$K_0/K_1=MI\text{-}/MI\text{+}$$

where MI- represents the mutual information value of the first half of the blocklength and MI+ represents the mutual information value for the second half of the blocklength. In this case, to enhance a performance of FRANK polar coding by using an adjusted dimensionality factor, UE 120 may adjust a value for $K_0$, such that:

$$K_0'=K_0-\Delta K$$

where $K_0'$ represents the adjusted dimensionality factor. In this case, UE 120 may construct ($K_0'$, N/2) and ($K_1$, N/2) code for encoding, thereby resulting in improved performance for FRANK polar coding relative to constructing ($K_0$, N/2) and ($K_1$, N/2) code for FRANK polar coding.

Figure 8B:
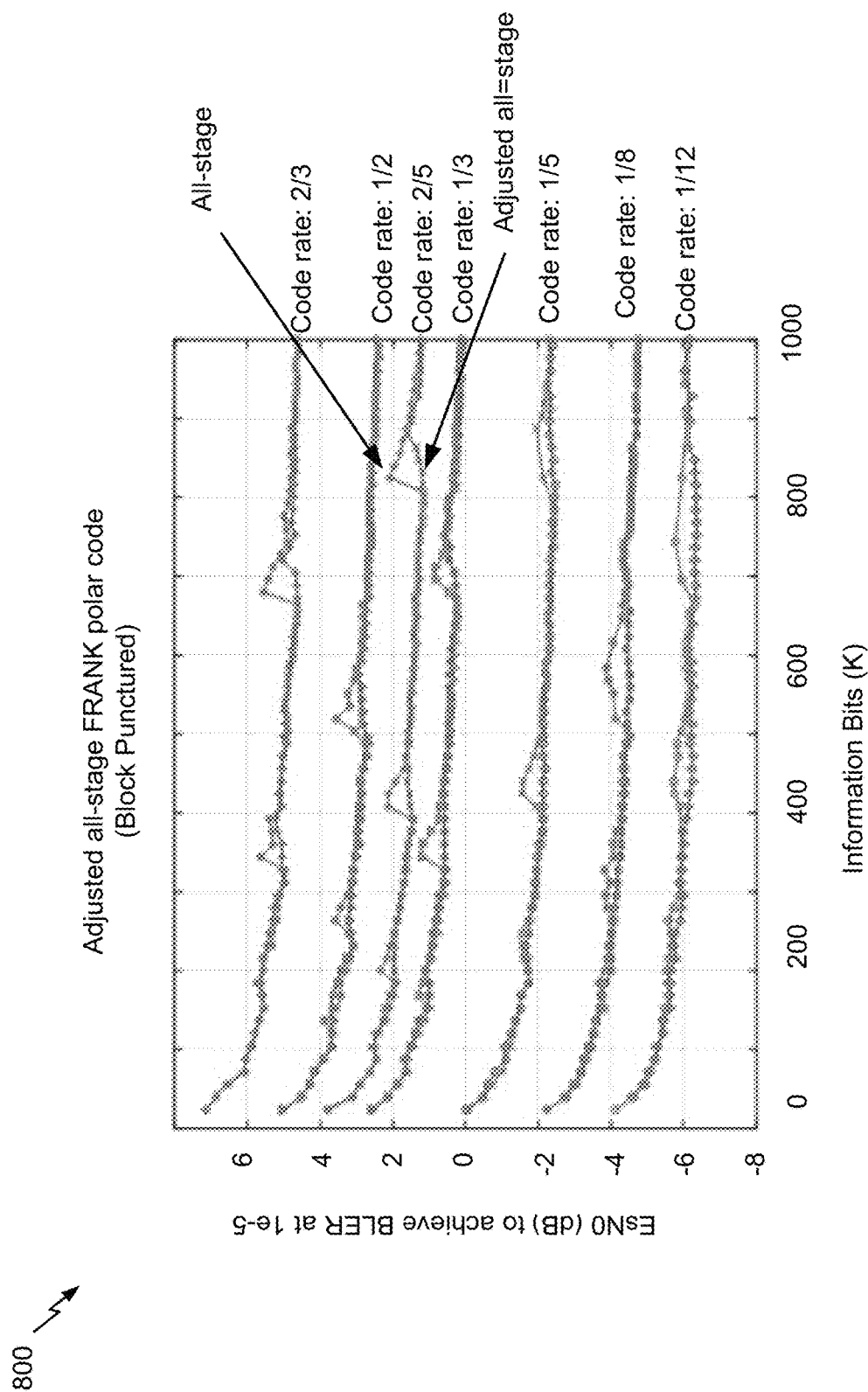

In some aspects, UE 120 may determine a value for $\Delta K$ based at least in part on a quantity of punctured bits. For example, UE 120 may determine the value for $\Delta K$ such that:

$$\Delta K=f((N-M)/N)$$

where f represents a particular function. In some aspects, UE 120 may determine a value for $\Delta K$ based at least in part on a code rate, such that:

$$\Delta K = \begin{cases} \min\left(aR^2\left(M - \dfrac{N}{2}\right), 5\right), & \text{if } \dfrac{M}{N} < 0.9 \text{ and } M > 256 \\ 0, & \text{if } \dfrac{M}{N} \geq 0.9 \text{ or } M \leq 256 \end{cases}$$

where a represents a ratio, such that 0<a<1 (e.g., a may be 0.8). In this way, by using adjusted all-stage punctured FRANK polar coding, UE 120 improves transmitter performance by reducing spikes related to BLER for the encoding code as shown in FIG. 8B.

Figure 8C:
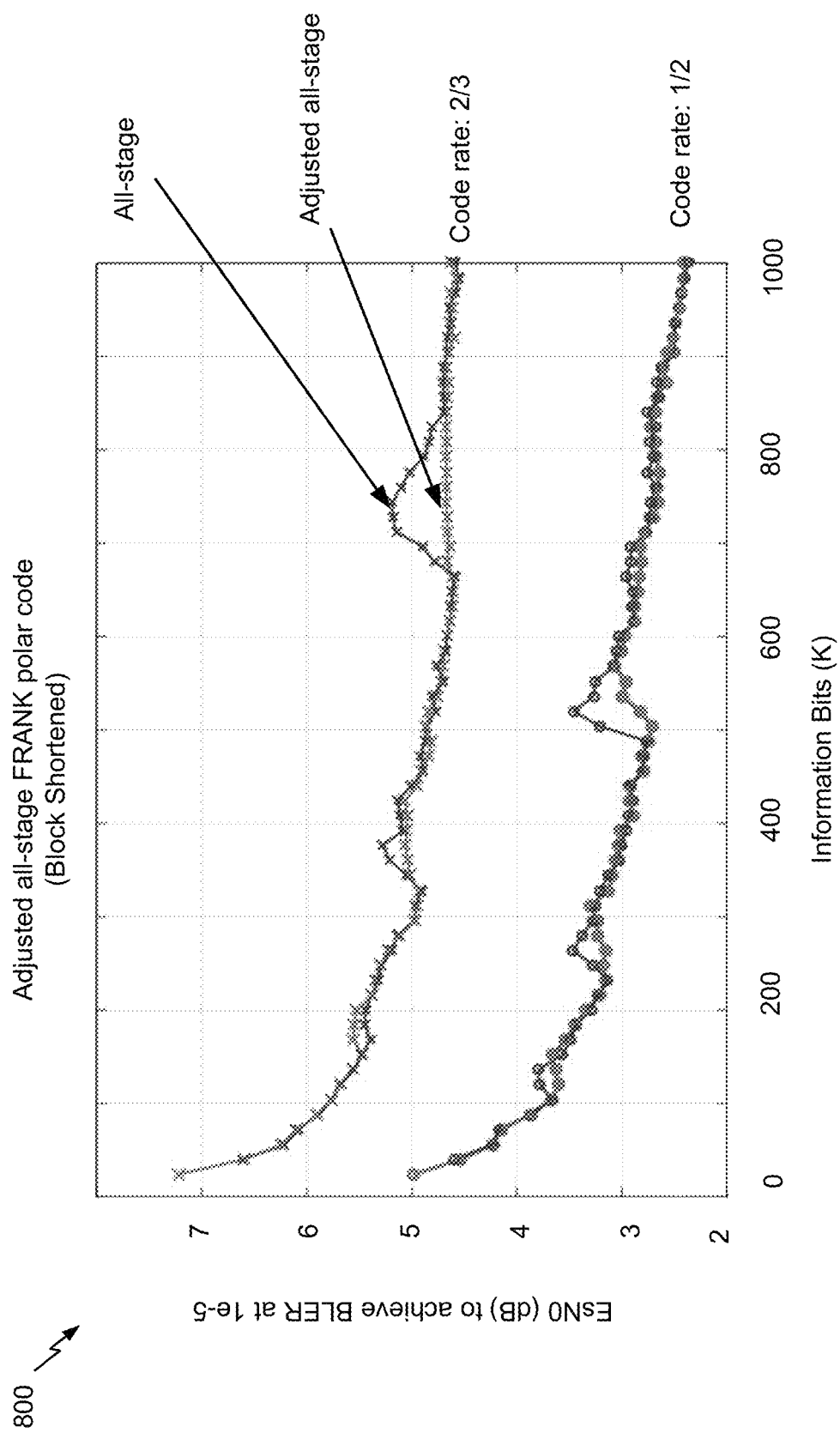

In some aspects, UE 120 may construct adjusted all-stage shortened FRANK polar code for encoding the URLLC data. In this case, UE 120 may select a first quantity of bits, S, for shortening, such that:

$$S=N-M.$$

where a last S bits are shortened in a length-N sequence. UE 120 may determine mutual information (MI) values for each bit, such that:

$$MI_{shortened}=(K+\Delta K)/M$$

$$MI_{non\text{-}shortened}=+\inf$$

where +inf represents positive infinity (or a threshold positive value). To enhance a performance of FRANK polar coding, UE 120 may adjust a value for dimensionality factor $K_1$, such that:

$$K_1'=K_1-\Delta K$$

where $K_1'$ represents the adjusted dimensionality factor for $K_1$. In this case, UE 120 may use, as a polar code for encoding, ($K_0$, N/2) and ($K_1'$, N/2), thereby resulting in improved performance for FRANK polar coding relative to using ($K_0$, N/2) and ($K_1$, N/2) for FRANK polar coding, as shown in FIG. 8C. In this way, UE 120 may reduce spikes related to BLER for shortened FRANK polar coding. In some aspects, UE 120 may select between adjusted all-stage punctured FRANK polar coding and adjusted all-stage shortened FRANK polar coding based at least in part on a coding rate.

Figure 8D:
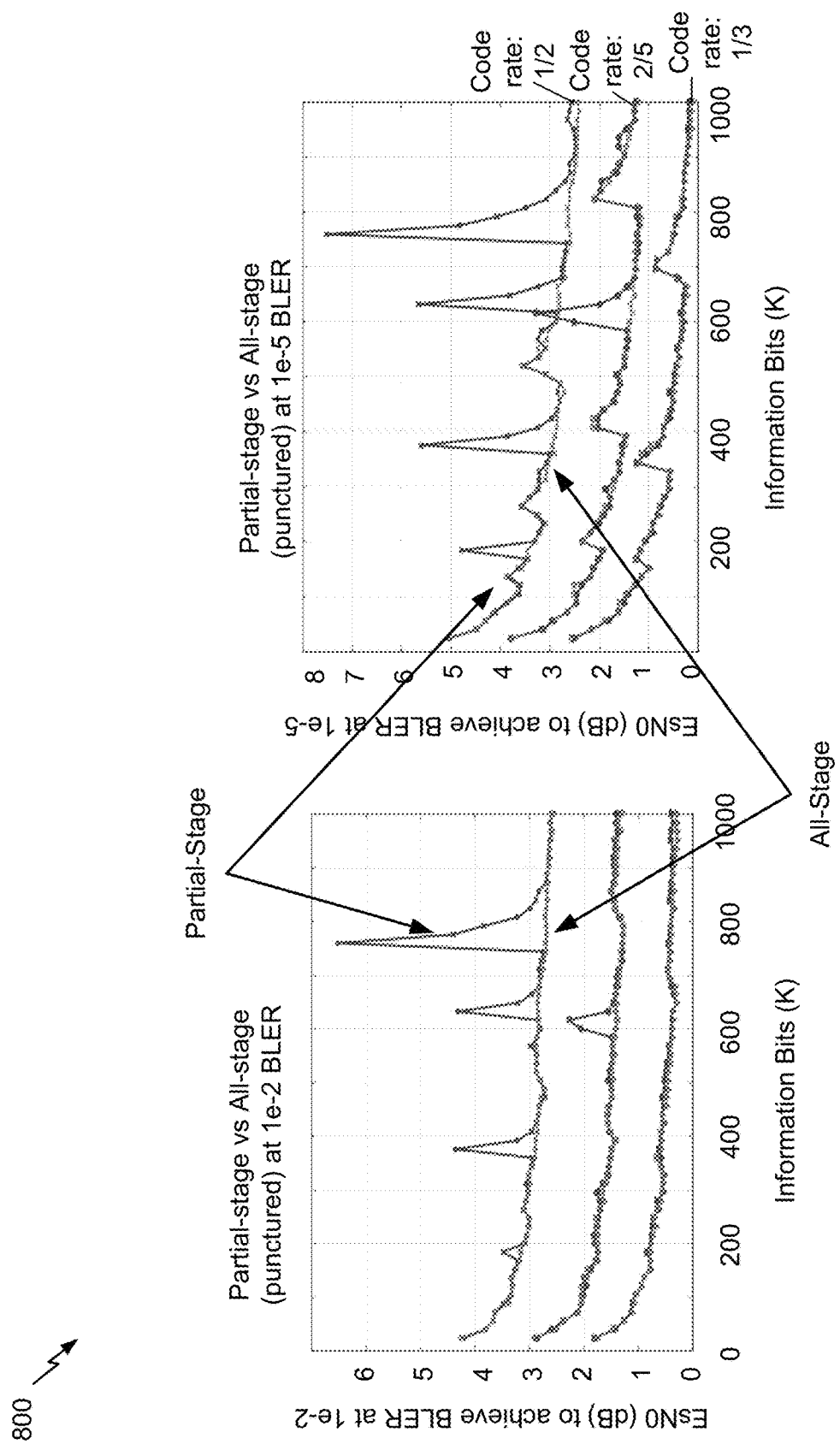

In some aspects, UE 120 may construct adjusted partial-stage punctured or shortened FRANK polar code for encoding the URLLC data, in order to reduce the construction complexity and resource overhead. However, partial-stage Frank polar code may have larger spikes than all-stage Frank polar code, as shown by FIG. 8D, as a result of, for all stage Frank polar code, a non-uniform input distribution relating to puncturing/shortening propagating to all stages in the recursive splitting process; however, for partial stage Frank polar code, the sequence within threshold block length has fixed bit reliability order.

Figure 8E:
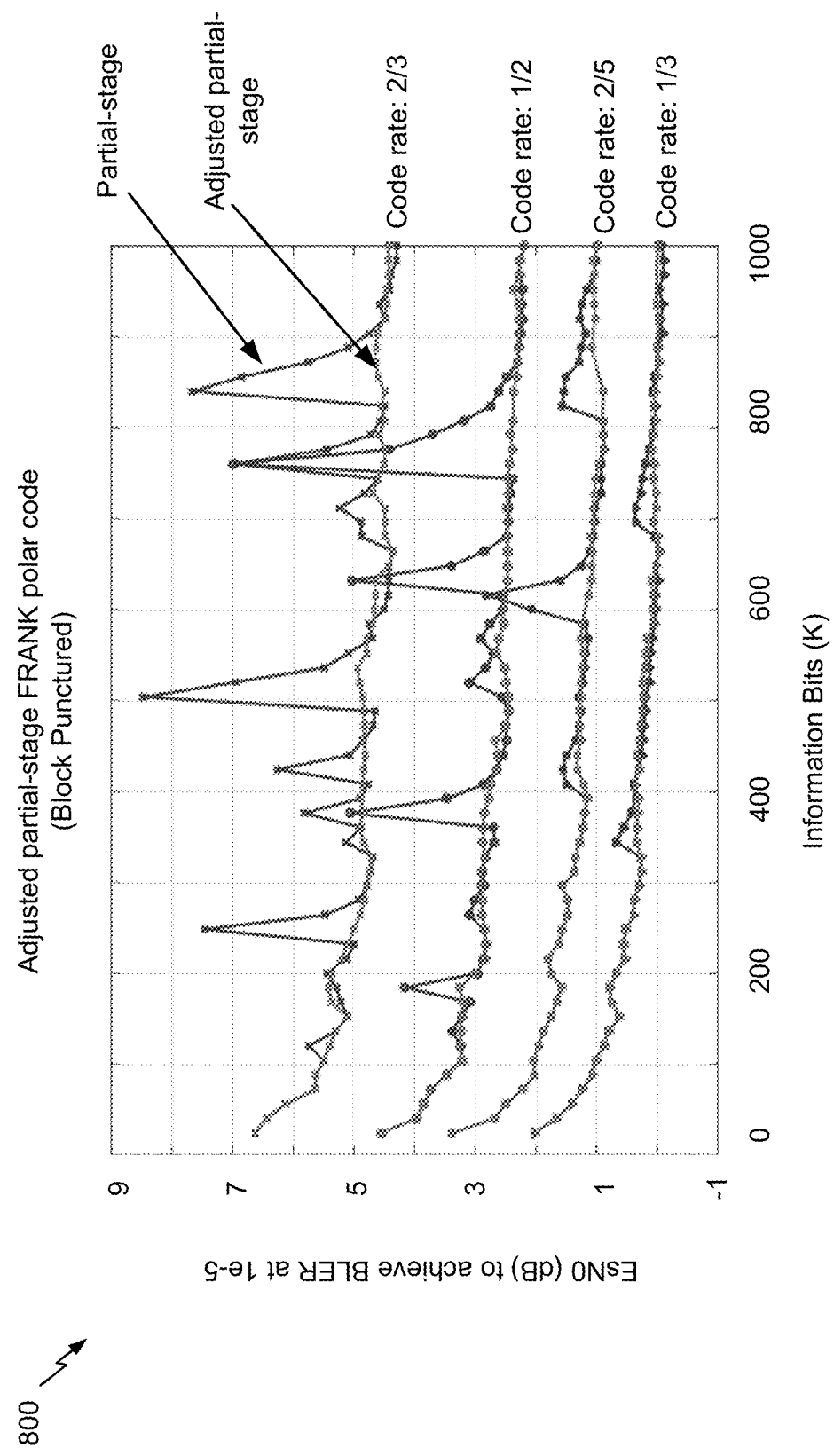

In the case of constructing adjusted partial-stage punctured Frank polar code, UE 120 may, for a set of stages i to ceiling(log 2(M)) and for $N_i>N_{TH}$, divide a sequence of information bits of length $N_i$ into two sub-sequences with length $N_i/2$, and may determine values $K_{i,0}$ and $K_{i,1}$ in each sub-sequence, such that:

$$K_{i,0} = \left\lfloor R^2 + \left(-\dfrac{|R-0.5|}{32} + \dfrac{1}{64}\right) * \left(M - \sum_{j=1}^{i} N/2^j\right)\right\rfloor$$

$$K_{i,1} = K_i - K_{i,0}$$

where $N_i$ represents a value for N for a sub-sequence i; $M=M_i$ and $M_i$ is a blocklength of the sub-sequence; $N_{TH}$ is a configurable threshold; $K_{i,0}$ represents a value for $K_0$ for sub-sequence i; $K_{i,1}$ represents a value for $K_1$ for sub-sequence i; $N_1=N$; and $K_1=K+\Delta K$. In this case, UE 120 may decrement $N_i$ such that $N_i=N_{i-1}/2$, and may continue to determine dimensionality factors $K_{i,0}$ and $K_{i,1}$ for each subsequence that satisfies $N_i>N_{TH}$. Further, for sub-sequences $N_i \leq N_{TH}$, UE 120 may select values for $K_{i,0}$ and $K_{i,1}$ from a static sequence with a particular reliability order. To use an adjusted dimensionality factor for adjusted partial-stage punctured FRANK polar code, UE 120 may select a quantity $K_{i,0}'=K_{i,0}-\Delta K_1$ information bits, and may exclude the first $\Delta K-\Delta K_1$ information bits of the $K_{i,0}'$ information bits from an information bit set. In this way, UE 120 reduces error propagation by excluding the first one or more bits. In contrast, for adjusted partial-stage shortened FRANK polar code, UE 120 may select a quantity $K_{i,1}'=K_{i,1}-\Delta K_1$ information bits, and may exclude the first $\Delta K - \Delta K_1$ information bits of the $K_{i,1}'$ information bits from an information bit set. In this way, UE 120 reduces spikes related to BLER for partial-stage FRANK polar coding, thereby improving transmitter performance for UE 120, as shown by FIG. 8E.

As further shown in FIG. 8A, and by reference number 820, UE 120 may encode data using the constructed code. For example, UE 120 may use a FRANK polar coding scheme using the constructed code to encode URLLC data of a URLLC communication for transmission to BS 110. In some aspects, UE 120 may encode URLLC data using adjusted all-stage punctured FRANK polar code, adjusted all-stage shortened FRANK polar code, adjusted partial-stage punctured FRANK polar code, adjusted partial-stage shortened FRANK polar code, and/or the like.

As further shown in FIG. 8A, and by reference number 830, UE 120 may transmit the encoded data. For example, UE 120 may transmit a URLLC communication encoded using the constructed code, and BS 110 may decode the URLLC communication to receive URLLC data. In this way, UE 120 uses an adjusted dimensionality factor to construct code for encoding data, thereby enabling UE 120 to satisfy one or more criteria of URLLC communication, such as enabling HARQ transmission, enabling blocklengths greater than a threshold, and/or the like.

In some aspects, using adjusted FRANK polar coding removes a restriction on maximum blocklength of the encoding code, encoding code rate, and rate matching pattern that may occur with FRANK polar coding. In some aspects, both adjusted full-stage and partial-stage FRANK polar code reduce the spikes in achievable SNR and improve an error floor of polar code when the fraction of shortened or punctured bits is large. In some aspects, a partial stage adjusted Frank polar code construction method enables the transmitter device to flexibly extend an existing polar sequence to an arbitrary blocklength polar code regardless of a construction method for an existing polar sequence. In some aspects, full stage adjusted FRANK polar code may have better performance than partial stage adjusted FRANK polar code, and partial stage adjusted FRANK polar code may have reduced construction complexity relative to full stage adjusted FRANK polar code. In some aspects, partial-stage adjusted FRANK polar code construction may enable a transmitter device to satisfy a low-latency requirement of URLLC transmission and to perform on-the-fly construction.

As indicated above, FIGS. 8A-8E are provided as an example. Other examples may differ from what is described with respect to FIGS. 8A-8E.

Figure 9:
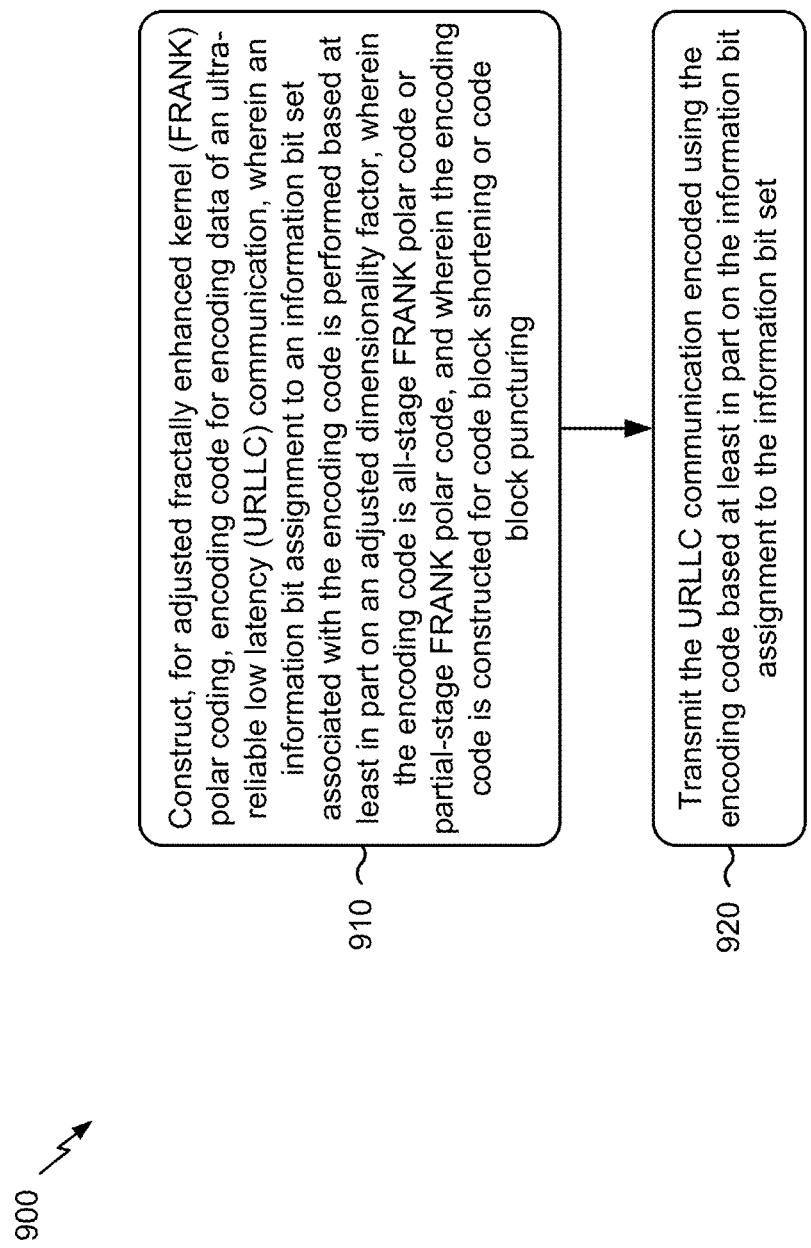
FIG. 9 is a diagram illustrating an example process performed, for example, by a transmitter device, in accordance with various aspects of the present disclosure.

FIG. 9 is a diagram illustrating an example process 900 performed, for example, by a transmitter device, in accordance with various aspects of the present disclosure. Example process 900 is an example where a transmitter device (e.g., UE 120 and/or the like) performs operations associated with FRANK polar coding.

As shown in FIG. 9, in some aspects, process 900 may include constructing, for adjusted fractally enhanced kernel (FRANK) polar coding, encoding code for encoding data of an ultra-reliable low latency (URLLC) communication, wherein an information bit assignment to an information bit set associated with the encoding code is performed based at least in part on an adjusted dimensionality factor, wherein the encoding code is all-stage FRANK polar code or partial-stage FRANK polar code, and wherein the encoding code is constructed for code block shortening or code block puncturing (block 910). For example, the transmitter device (e.g., using controller/processor 240, transmit processor 220, TX MIMO processor 230, MOD 232, antenna 234, controller/processor 280, transmit processor 264, TX MIMO processor 266, MOD 254, antenna 252, and/or the like) may construct, for adjusted fractally enhanced kernel (FRANK) polar coding, encoding code for encoding data of an ultra-reliable low latency (URLLC) communication wherein an information bit assignment to an information bit set associated with the encoding code is performed based at least in part on an adjusted dimensionality factor, wherein the encoding code is all-stage FRANK polar code or partial-stage FRANK polar code and wherein the encoding code is constructed for code block shortening or code block puncturing; and, as described above. In some aspects, an information bit assignment to an information bit set associated with the encoding code is performed based at least in part on an adjusted dimensionality factor. In some aspects, the encoding code is all-stage FRANK polar code or partial-stage FRANK polar code. In some aspects, the encoding code is constructed for code block shortening or code block puncturing.

As further shown in FIG. 9, in some aspects, process 900 may include transmitting the URLLC communication encoded using the encoding code based at least in part on the information bit assignment to the information bit set (block 920). For example, the transmitter device (e.g., using controller/processor 240, transmit processor 220, TX MIMO processor 230, MOD 232, antenna 234, controller/processor 280, transmit processor 264, TX MIMO processor 266, MOD 254, antenna 252, and/or the like) may transmit the URLLC communication encoded using the encoding code based at least in part on the information bit assignment to the information bit set, as described above.

Process 900 may include additional aspects, such as any single aspect or any combination of aspects described below and/or in connection with one or more other processes described elsewhere herein.

In a first aspect, the transmitter device is configured to add a first one or more information bits to the information bit set and remove a second one or more bits from the information bit set. In some aspects, a first quantity of the first one or more information bits and a second quantity of the second one or more information bits is a common quantity.

In a second aspect, alone or in combination with the first aspect, the transmitter device is configured to add one or more information bits or remove one or more information bits from the information bit set based at least in part on at least one of a code rate, a code block length, a shortening configuration, a puncturing configuration, a reliability parameter, a bit location parameter, or an error propagation parameter.

In a third aspect, alone or in combination with one or more of the first and second aspects, the transmitter device is configured to determine a quantity of information bits for one or more sub-sequences of the information bit set based at least in part on a corresponding sub-sequence length and a mutual information allocation parameter.

In a fourth aspect, alone or in combination with one or more of the first through third aspects, the transmitter device is configured to select the information bit set based at least in part on a length parameter and a reliability order parameter.

In a fifth aspect, alone or in combination with one or more of the first through fourth aspects, the encoding code is constructed for all-stage FRANK polar coding and for code block puncturing.

In a sixth aspect, alone or in combination with one or more of the first through fifth aspects, the encoding code is constructed for all-stage FRANK polar coding and for code block shortening.

In a seventh aspect, alone or in combination with one or more of the first through sixth aspects, the encoding code is constructed for partial-stage FRANK polar coding and for code block puncturing.

In an eighth aspect, alone or in combination with one or more of the first through seventh aspects, the encoding code is constructed for partial-stage FRANK polar coding and for code block shortening.

In a ninth aspect, alone or in combination with one or more of the first through eighth aspects, the adjusted dimensionality factor is determined based at least in part on a quantity of punctured bits for code block puncturing.

In a tenth aspect, alone or in combination with one or more of the first through ninth aspects, the adjusted dimensionality factor is determined based at least in part on a quantity of shortened bits for code block shortening.

In an eleventh aspect, alone or in combination with one or more of the first through tenth aspects, the adjusted dimensionality factor is determined based at least in part on a block length.

In a twelfth aspect, alone or in combination with one or more of the first through eleventh aspects, the adjusted dimensionality factor is determined based at least in part on a preconfigured value.

In a thirteenth aspect, alone or in combination with one or more of the first through twelfth aspects, the adjusted dimensionality factor is a plurality of adjusted dimensionality factors corresponding to a plurality of sub-sequences of a sequence associated with the information bit set and the encoding code.

In a fourteenth aspect, alone or in combination with one or more of the first through thirteenth aspects, at least one of a block length or a code rate for the encoding code is greater than a threshold.

In a fifteenth aspect, alone or in combination with one or more of the first through fourteenth aspects, the encoding code enables hybrid automatic repeat request (HARQ) transmission.

Although FIG. 9 shows example blocks of process 900, in some aspects, process 900 may include additional blocks, fewer blocks, different blocks, or differently arranged blocks than those depicted in FIG. 9. Additionally, or alternatively, two or more of the blocks of process 900 may be performed in parallel.

Figure 10:
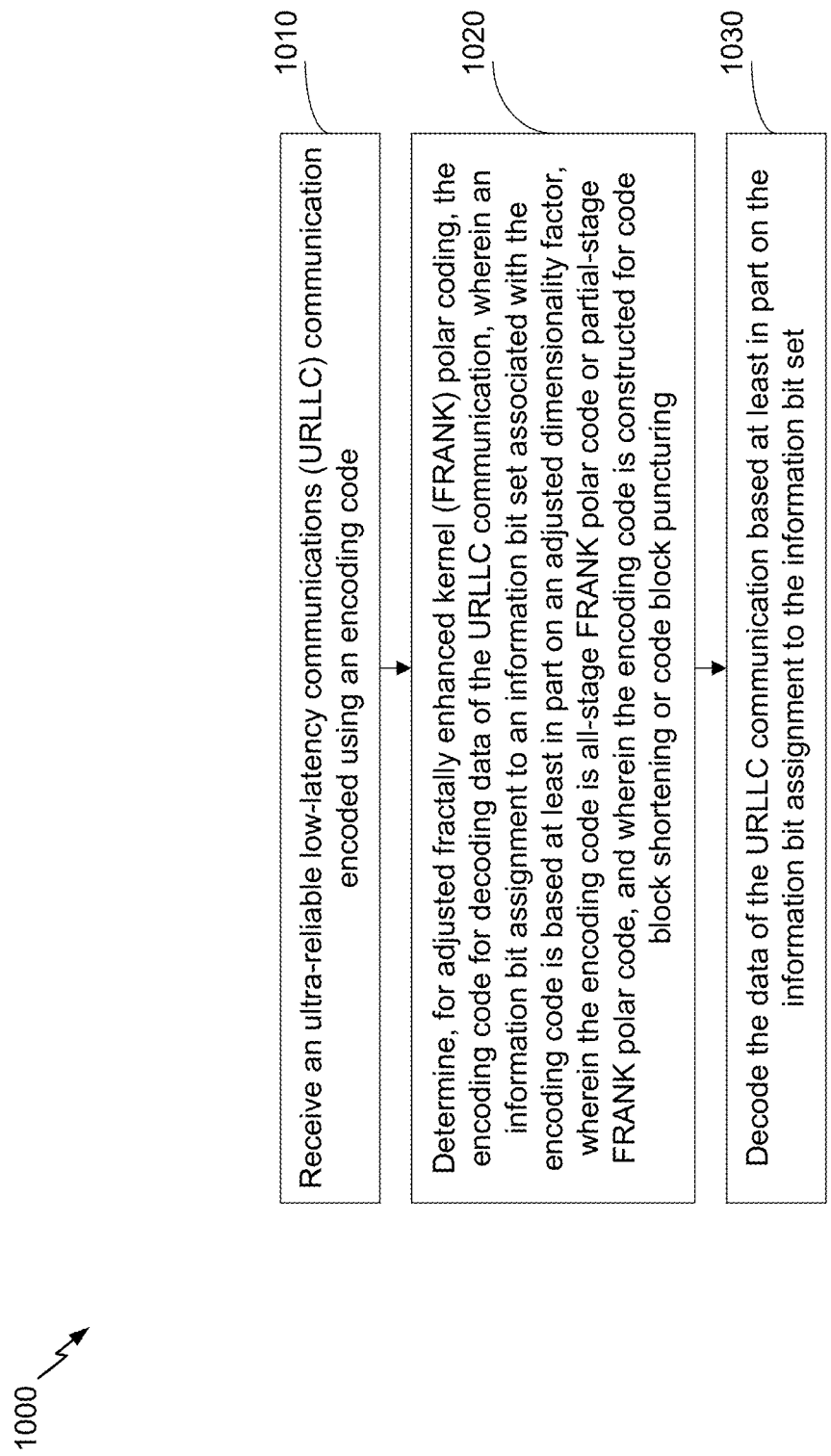
FIG. 10 is a diagram illustrating an example process performed, for example, by a receiver device, in accordance with various aspects of the present disclosure.

FIG. 10 is a diagram illustrating an example process 1000 performed, for example, by a receiver device, in accordance with various aspects of the present disclosure. Example process 1000 is an example where a receiver device (e.g., BS 110 and/or the like) performs operations associated with FRANK polar coding.

As shown in FIG. 10, in some aspects, process 1000 may include receiving an ultra-reliable low-latency communications (URLLC) communication encoded using a code (block 1010). For example, the receiver device (e.g., using antenna 234, DEMOD 232, MIMO detector 236, receive processor 238, controller/processor 240, antenna 252, DEMOD 254, MIMO detector 256, receive processor 258, controller/processor 280, and/or the like) may receive an ultra-reliable low-latency communications (URLLC) communication encoded using a code, as described above.

As further shown in FIG. 10, in some aspects, process 1000 may include determining, for adjusted fractally enhanced kernel (FRANK) polar coding, encoding code for decoding data of the URLLC communication, wherein an information bit assignment to an information bit set associated with the encoding code is based at least in part on an adjusted dimensionality factor, wherein the encoding code is all-stage FRANK polar code or partial-stage FRANK polar code, and wherein the encoding code is constructed for code block shortening or code block puncturing (block 1020). For example, the receiver device (e.g., using antenna 234, DEMOD 232, MIMO detector 236, receive processor 238, controller/processor 240, antenna 252, DEMOD 254, MIMO detector 256, receive processor 258, controller/processor 280, and/or the like) may determine, for adjusted fractally enhanced kernel (FRANK) polar coding, encoding code for decoding data of the URLLC communication, wherein an information bit assignment to an information bit set associated with the encoding code is based at least in part on an adjusted dimensionality factor, wherein the encoding code is all-stage FRANK polar code or partial-stage FRANK polar code and wherein the encoding code is constructed for code block shortening or code block puncturing; and, as described above. In some aspects, an information bit assignment to an information bit set associated with the encoding code is based at least in part on an adjusted dimensionality factor. In some aspects, the encoding code is all-stage FRANK polar code or partial-stage FRANK polar code. In some aspects, the encoding code is constructed for code block shortening or code block puncturing.

As further shown in FIG. 10, in some aspects, process 1000 may include decoding the data of the URLLC communication based at least in part on the information bit assignment to the information bit set (block 1030). For example, the receiver device (e.g., using antenna 234, DEMOD 232, MIMO detector 236, receive processor 238, controller/processor 240, antenna 252, DEMOD 254, MIMO detector 256, receive processor 258, controller/processor 280, and/or the like) may decode the data of the URLLC communication based at least in part on the information bit assignment to the information bit set, as described above.

Process 1000 may include additional aspects, such as any single aspect or any combination of aspects described below and/or in connection with one or more other processes described elsewhere herein.

In a first aspect, a first one or more information bits is added to the information bit set and a second one or more bits is removed from the information bit set. In some aspects, a first quantity of the first one or more information bits and a second quantity of the second one or more information bits is a common quantity.

In a second aspect, alone or in combination with the first aspect, one or more information bits is added or removed from the information bit set based at least in part on at least one of a code rate, a code block length, a shortening configuration, a puncturing configuration, a reliability parameter, a bit location parameter, or an error propagation parameter.

In a third aspect, alone or in combination with one or more of the first and second aspects, the receiver device is configured to determine a quantity of information bits for one or more sub-sequences of the information bit set based at least in part on a corresponding sub-sequence length and a mutual information allocation parameter.

In a fourth aspect, alone or in combination with one or more of the first through third aspects, the receiver device is configured to select the information bit set based at least in part on a length parameter and a reliability order parameter.

In a fifth aspect, alone or in combination with one or more of the first through fourth aspects, the encoding code is constructed for all-stage FRANK polar coding and for code block puncturing.

In a sixth aspect, alone or in combination with one or more of the first through fifth aspects, the encoding code is constructed for all-stage FRANK polar coding and for code block shortening.

In a seventh aspect, alone or in combination with one or more of the first through sixth aspects, the encoding code is constructed for partial-stage FRANK polar coding and for code block puncturing.

In an eighth aspect, alone or in combination with one or more of the first through seventh aspects, the encoding code is constructed for partial-stage FRANK polar coding and for code block shortening.

In a ninth aspect, alone or in combination with one or more of the first through eighth aspects, the adjusted dimensionality factor is determined based at least in part on a quantity of punctured bits for code block puncturing.

In a tenth aspect, alone or in combination with one or more of the first through ninth aspects, the adjusted dimensionality factor is determined based at least in part on a quantity of shortened bits for code block shortening.

In an eleventh aspect, alone or in combination with one or more of the first through tenth aspects, the adjusted dimensionality factor is determined based at least in part on a block length.

In a twelfth aspect, alone or in combination with one or more of the first through eleventh aspects, the adjusted dimensionality factor is determined based at least in part on a preconfigured value.

In a thirteenth aspect, alone or in combination with one or more of the first through twelfth aspects, the adjusted dimensionality factor is a plurality of adjusted dimensionality factors corresponding to a plurality of sub-sequences of a sequence associated with the information bit set and the encoding code.

In a fourteenth aspect, alone or in combination with one or more of the first through thirteenth aspects, at least one of a block length or a code rate for the encoding code is greater than a threshold.

In a fifteenth aspect, alone or in combination with one or more of the first through fourteenth aspects, the encoding code enables hybrid automatic repeat request (HARM) transmission.

Although FIG. 10 shows example blocks of process 1000, in some aspects, process 1000 may include additional blocks, fewer blocks, different blocks, or differently arranged blocks than those depicted in FIG. 10. Additionally, or alternatively, two or more of the blocks of process 1000 may be performed in parallel.

The foregoing disclosure provides illustration and description, but is not intended to be exhaustive or to limit the aspects to the precise form disclosed. Modifications and variations may be made in light of the above disclosure or may be acquired from practice of the aspects.

As used herein, the term "component" is intended to be broadly construed as hardware, firmware, or a combination of hardware and software. As used herein, a processor is implemented in hardware, firmware, or a combination of hardware and software.

As used herein, satisfying a threshold may, depending on the context, refer to a value being greater than the threshold, greater than or equal to the threshold, less than the threshold, less than or equal to the threshold, equal to the threshold, not equal to the threshold, and/or the like.

It will be apparent that systems and/or methods described herein may be implemented in different forms of hardware, firmware, or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based, at least in part, on the description herein.

Even though particular combinations of features are recited in the claims and/or disclosed in the specification, these combinations are not intended to limit the disclosure of various aspects. In fact, many of these features may be combined in ways not specifically recited in the claims and/or disclosed in the specification. Although each dependent claim listed below may directly depend on only one claim, the disclosure of various aspects includes each dependent claim in combination with every other claim in the claim set. A phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "set" and "group" are intended to include one or more items (e.g., related items, unrelated items, a combination of related and unrelated items, and/or the like), and may be used interchangeably with "one or more." Where only one item is intended, the term "only one" or similar language is used. Also, as used herein, the terms "has," "have," "having," and/or the like are intended to be open-ended terms. Further, the phrase "based on" is intended to mean "based, at least in part, on" unless explicitly stated otherwise.

What is claimed is:

1. A method of wireless communication performed by a transmitter device, comprising:

constructing, for adjusted fractally enhanced kernel (FRANK) polar coding, encoding code for encoding data of an ultra-reliable low latency (URLLC) communication, wherein the adjusted FRANK polar coding removes a restriction on maximum blocklength of the encoding code, an encoding code rate, and a rate matching pattern that occurs with FRANK polar coding, wherein the adjusted FRANK polar coding enables the transmitter device to flexibly extend an existing polar sequence to an arbitrary blocklength polar code, wherein an information bit assignment to an information bit set associated with the encoding code is performed based at least in part on an adjusted dimensionality factor, wherein the transmitter device is configured to remove one or more information bits from the information bit set based at least in part on at least one of a code rate or a code block length, wherein the encoding code is all-stage FRANK polar code or partial-stage FRANK polar code, and wherein the encoding code is constructed for code block shortening or code block puncturing; and transmitting the URLLC communication encoded using the encoding code based at least in part on the information bit assignment to the information bit set.

2. The method of claim 1, wherein the transmitter device is further configured to add first one or more information bits to the information bit set, wherein the one or more information bits are second one or more information bits, and wherein a first quantity of the first one or more information bits and a second quantity of the second one or more information bits is a common quantity.

3. The method of claim 1, wherein the transmitter device is further configured to add one or more information bits to the information bit set based at least in part on at least one of the code rate, the code block length, a shortening configuration, a puncturing configuration, a reliability parameter, a bit location parameter, or an error propagation parameter.

4. The method of claim 1, wherein the transmitter device is configured to determine a quantity of information bits for one or more sub-sequences of the information bit set based at least in part on a corresponding sub-sequence length and a mutual information allocation parameter.

5. The method of claim 1, wherein the transmitter device is configured to select the information bit set based at least in part on a length parameter and a reliability order parameter.

6. The method of claim 1, wherein the encoding code is constructed for all-stage FRANK polar coding and for code block puncturing.

7. The method of claim 1, wherein the encoding code is constructed for all-stage FRANK polar coding and for code block shortening.

8. The method of claim 1, wherein the encoding code is constructed for partial-stage FRANK polar coding and for code block puncturing.

9. The method of claim 1, wherein the encoding code is constructed for partial-stage FRANK polar coding and for code block shortening.

10. The method of claim 1, wherein the adjusted dimensionality factor is determined based at least in part on a quantity of punctured bits for code block puncturing.

11. The method of claim 1, wherein the adjusted dimensionality factor is determined based at least in 1, the part on a quantity of shortened bits for code block shortening.

12. The method of claim 1, wherein the adjusted dimensionality factor is determined based at least in part on a block length.

13. The method of claim 1, wherein the adjusted dimensionality factor is determined based at least in part on a preconfigured value.

14. The method of claim 1, wherein a plurality of adjusted dimensionality factors, including the adjusted dimensionality factor, correspond to a plurality of sub-sequences of a sequence associated with the information bit set and the encoding code.

15. The method of claim 1, wherein at least one of the code block length or the code rate is greater than a threshold.

16. The method of claim 1, wherein the encoding code enables hybrid automatic repeat request (HARQ) transmission.

17. The method of claim 1, wherein the encoding code is the partial-stage FRANK polar code, and wherein the partial-stage FRANK polar code enables the transmitter device to satisfy a low-latency requirement of URLLC transmission.

18. A method of wireless communication performed by a receiver device, comprising:

receiving an ultra-reliable low-latency communications (URLLC) communication encoded using an encoding code;

determining, for adjusted fractally enhanced kernel (FRANK) polar coding, encoding code for decoding data of the URLLC communication, wherein the adjusted FRANK polar coding removes a restriction on maximum blocklength of the encoding code, an encoding code rate, and a rate matching pattern that occurs with FRANK polar coding, wherein the adjusted FRANK polar coding enables flexibly extending an existing polar sequence to an arbitrary blocklength polar code, wherein an information bit assignment to an information bit set associated with the encoding code is based at least in part on an adjusted dimensionality factor, wherein one or more information bits are removed from the information bit set based at least in part on at least one of a code rate or a code block length, wherein the encoding code is all-stage FRANK polar code or partial-stage FRANK polar code, and wherein the encoding code is constructed for code block shortening or code block puncturing; and decoding the data of the URLLC communication based at least in part on the information bit assignment to the information bit set.

19. The method of claim 18, wherein first one or more information bits are added to the information bit set, wherein the one or more information bits are second one or more information bits, and wherein a first quantity of the first one or more information bits and a second quantity of the second one or more information bits is a common quantity.

20. The method of claim 18, wherein one or more other information bits are added to the information bit set based at least in part on at least one of the code rate, the code block length, a shortening configuration, a puncturing configuration, a reliability parameter, a bit location parameter, or an error propagation parameter.

21. The method of claim 18, wherein the receiver device is configured to determine a quantity of information bits for one or more sub-sequences of the information bit set based at least in part on a corresponding sub-sequence length and a mutual information allocation parameter.

22. The method of claim 18, wherein the receiver device is configured to select the information bit set based at least in part on a length parameter and a reliability order parameter.

23. The method of claim 18, wherein the encoding code is constructed for all-stage FRANK polar coding and for code block puncturing.

24. The method of claim 18, wherein the encoding code is constructed for all-stage FRANK polar coding and for code block shortening.

25. The method of claim 18, wherein the encoding code is constructed for partial-stage FRANK polar coding and for code block puncturing.

26. The method of claim 18, wherein the encoding code is constructed for partial-stage FRANK polar coding and for code block shortening.

27. The method of claim 18, wherein the adjusted dimensionality factor is determined based at least in part on a quantity of punctured bits for code block puncturing.

28. The method of claim 18, wherein the adjusted dimensionality factor is determined based at least in part on a quantity of shortened bits for code block shortening.

29. The method of claim 18, wherein the adjusted dimensionality factor is determined based at least in part on a block length.

30. The method of claim 18, wherein the adjusted dimensionality factor is determined based at least in part on a preconfigured value.

31. The method of claim 18, wherein a plurality of adjusted dimensionality factors, including the adjusted dimensionality factor, correspond to a plurality of sub-sequences of a sequence associated with the information bit set and the encoding code.

32. The method of claim 18, wherein at least one of code block length or the code rate is greater than a threshold.

33. The method of claim 18, wherein the encoding code enables hybrid automatic repeat request (HARQ) transmission.

34. A transmitter device for wireless communication, comprising:
   a memory; and
   one or more processors operatively coupled to the memory, the memory and the one or more processors configured to:
      construct, for adjusted fractally enhanced kernel (FRANK) polar coding, encoding code for encoding data of an ultra-reliable low latency (URLLC) communication,
         wherein the adjusted FRANK polar coding removes a restriction on maximum blocklength of the encoding code, an encoding code rate, and a rate matching pattern that occurs with FRANK polar coding, and
         wherein the adjusted FRANK polar coding enables the transmitter device to flexibly extend an existing polar sequence to an arbitrary blocklength polar code,
         wherein an information bit assignment to an information bit set associated with the encoding code is performed based at least in part on an adjusted dimensionality factor,
         wherein the transmitter device is configured to remove one or more information bits from the information bit set based at least in part on at least one of a code rate or a code block length,
         wherein the encoding code is all-stage FRANK polar code or partial-stage FRANK polar code, and
         wherein the encoding code is constructed for code block shortening or code block puncturing; and
      transmit the URLLC communication encoded using the encoding code based at least in part on the information bit assignment to the information bit set.

35. The transmitter device of claim 34, wherein the transmitter device is further configured to add first one or more information bits to the information bit set,
   wherein the one or more information bits are second one or more information bits, and
   wherein a first quantity of the first one or more information bits and a second quantity of the second one or more information bits is a common quantity.

36. The transmitter device of claim 34, wherein the transmitter device is further configured to add one or more information bits to the information bit set based at least in part on at least one of the code rate, the code block length, a shortening configuration, a puncturing configuration, a reliability parameter, a bit location parameter, or an error propagation parameter.

37. The transmitter device of claim 34, wherein the transmitter device is configured to determine a quantity of information bits for one or more sub-sequences of the information bit set based at least in part on a corresponding sub-sequence length and a mutual information allocation parameter.

38. The transmitter device of claim 34, wherein the transmitter device is configured to select the information bit set based at least in part on a length parameter and a reliability order parameter.

39. The transmitter device of claim 34, wherein the encoding code is constructed for all-stage FRANK polar coding and for code block puncturing.

40. The transmitter device of claim 34, wherein the encoding code is constructed for all-stage FRANK polar coding and for code block shortening.

41. The transmitter device of claim 34, wherein the encoding code is constructed for partial-stage FRANK polar coding and for code block puncturing.

42. The transmitter device of claim 34, wherein the encoding code is constructed for partial-stage FRANK polar coding and for code block shortening.

43. A receiver device for wireless communication, comprising:
   a memory; and
   one or more processors operatively coupled to the memory, the memory and the one or more processors configured to:
      receive an ultra-reliable low-latency communications (URLLC) communication encoded using a code;
      determine, for adjusted fractally enhanced kernel (FRANK) polar coding, encoding code for decoding data of the URLLC communication,
         wherein the adjusted FRANK polar coding removes a restriction on maximum blocklength of the encoding code, an encoding code rate, and a rate matching pattern that occurs with FRANK polar coding,
         wherein the adjusted FRANK polar coding enables flexibly extending an existing polar sequence to an arbitrary blocklength polar code,
         wherein an information bit assignment to an information bit set associated with the encoding code is based at least in part on an adjusted dimensionality factor,
         wherein one or more information bits are removed from the information bit set based at least in part on at least one of a code rate or a code block length,
         wherein the encoding code is all-stage FRANK polar code or partial-stage FRANK polar code, and
         wherein the encoding code is constructed for code block shortening or code block puncturing; and
      decode the data of the URLLC communication based at least in part on the information bit assignment to the information bit set.

44. The receiver device of claim 43,
   wherein first one or more information bits are added to the information bit set,
   wherein the one or more information bits are second one or more information bits, and wherein a first quantity of the first one or more information bits and a second quantity of the second one or more information bits is a common quantity.

45. The receiver device of claim 43, wherein one or more other information bits are added to the information bit set based at least in part on at least one of the code rate, the code block length, a shortening configuration, a puncturing configuration, a reliability parameter, a bit location parameter, or an error propagation parameter.

46. The receiver device of claim 43, wherein the receiver device is configured to determine a quantity of information bits for one or more sub-sequences of the information bit set based at least in part on a corresponding sub-sequence length and a mutual information allocation parameter.

47. The receiver device of claim 43, wherein the receiver device is configured to select the information bit set based at least in part on a length parameter and a reliability order parameter.

48. The receiver device of claim 43, wherein the encoding code is constructed for all-stage FRANK polar coding and for code block puncturing.

49. The device of claim 43, wherein the encoding code is constructed for all-stage FRANK polar coding and for code block shortening.

50. The receiver device of claim 43, wherein the encoding code is constructed for partial-stage FRANK polar coding and for code block puncturing.

* * * * *